United States Patent
Kawaguchi et al.

(10) Patent No.: US 10,251,265 B2
(45) Date of Patent: Apr. 2, 2019

(54) PREGREG, FILM WITH RESIN, METAL FOIL WITH RESIN, METAL-CLAD LAMINATE, AND PRINTED WIRING BOARD

(71) Applicant: HITACHI CHEMICAL COMPANY, LTD., Tokyo (JP)

(72) Inventors: Akiko Kawaguchi, Tsukuba (JP); Nozomu Takano, Tsukuba (JP); Yasuyuki Mizuno, Chikusei (JP); Kazumasa Takeuchi, Chikusei (JP); Shigeru Haeno, Ichihara (JP); Yoshinori Nagai, Ichihara (JP); Masato Fukui, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/831,667

(22) Filed: Dec. 5, 2017

(65) Prior Publication Data

US 2018/0098425 A1    Apr. 5, 2018

Related U.S. Application Data

(62) Division of application No. 13/145,840, filed as application No. PCT/JP2010/051140 on Jan. 28, 2010, now abandoned.

(51) Int. Cl.
*H05K 1/03* (2006.01)
*H01L 23/14* (2006.01)
(Continued)

(52) U.S. Cl.
CPC ......... *H05K 1/0326* (2013.01); *C08F 220/18* (2013.01); *H01L 23/145* (2013.01);
(Continued)

(58) Field of Classification Search
None
See application file for complete search history.

(56) References Cited

U.S. PATENT DOCUMENTS

| 3,238,168 A | 3/1966 | Wolff |
| 3,932,932 A * | 1/1976 | Goodman ............ H05K 1/0265 |
| | | 174/266 |

(Continued)

FOREIGN PATENT DOCUMENTS

| JP | 8-283535 | 10/1996 |
| JP | 2001207020 | * 7/2001 |

(Continued)

OTHER PUBLICATIONS

Machine translation of JP2006274099, Hitoshi (Year: 2006).*
(Continued)

*Primary Examiner* — Shawn Mckinnon
(74) *Attorney, Agent, or Firm* — Fitch, Even, Tabin & Flannery, L.L.P.

(57) ABSTRACT

The present invention provides the prepreg being formed by impregnating a fiber base material with a resin composition and the resin composition comprising an acrylic resin, wherein the ratio of the peak height near 2240 cm$^{-1}$ due to nitrile groups ($P_{CN}$) with respect to the peak height near 1730 cm$^{-1}$ due to carbonyl groups ($P_{CO}$) in the IR spectrum of the cured resin composition ($P_{CN}/P_{CO}$) is no greater than 0.001 and the like in order to provide a prepreg, a film with a resin, a metal foil with a resin and a metal-clad laminate, which exhibit excellent bending resistance while also prevent ion migration and have excellent insulating reliability when printed wiring boards are fabricated, as well as a printed wiring board employing the same.

10 Claims, 7 Drawing Sheets

(51) Int. Cl.
*C08F 220/18* (2006.01)
*H05K 3/42* (2006.01)

(52) U.S. Cl.
CPC .......... *C08F 2220/1808* (2013.01); *C08F 2220/1891* (2013.01); *H01L 2924/0002* (2013.01); *H05K 3/427* (2013.01); *Y10T 428/31692* (2015.04); *Y10T 428/31855* (2015.04)

(56) References Cited

U.S. PATENT DOCUMENTS

| | | | |
|---|---|---|---|
| 4,020,209 | A | 4/1977 | Yuan |
| 6,616,971 | B2 | 9/2003 | Evans |
| 2005/0065252 | A1 | 3/2005 | Kawamura |

FOREIGN PATENT DOCUMENTS

| | | |
|---|---|---|
| JP | 2002-134907 | 5/2002 |
| JP | 2004-158798 | 6/2004 |
| JP | 2004263135 | 9/2004 |
| JP | 2006-152260 | 6/2006 |
| JP | 2006-219664 | 8/2006 |
| JP | 2006-274099 | 10/2006 |
| JP | 2006-316173 | 11/2006 |
| JP | 2007-191675 | 8/2007 |
| JP | 2007-224293 | 9/2007 |
| JP | 2007-297599 | 11/2007 |

OTHER PUBLICATIONS

Machine translation of JP2001207020, Murai et al. (Year: 2001).*
Japanese Office Action, Application No. P2010-017057 dated Oct. 28, 2014.
Japanese Office Action dated Nov. 5, 2013, in connection with counterpart Japanese Application No. JP 2010-017057.
Office Action dated Aug. 4, 2015, by the Japan Patent Office in regards to Japan Patent Application No. 2014-177344.
Japanese Office Action Application No. P2010-017057 dated Jun. 3, 2014.
English translation of International Preliminary Report dated Aug. 18, 2011.
Machine translation of JP 2006-274099.

* cited by examiner

PREGREG, FILM WITH RESIN, METAL FOIL WITH RESIN, METAL-CLAD LAMINATE, AND PRINTED WIRING BOARD

CROSS-REFERENCE TO RELATED APPLICATIONS

This application is a divisional application of application Ser. No. 13/145,840, having a 371(c) date of Jul. 22, 2011, which is a 371 National Stage Entry of PCT International Application No. PCT/JP2010/051140, filed Jan. 28, 2010, which claims priority of Japanese Application Nos. JP 2009-144561, filed Jun. 17, 2009 and JP 2009-017332, filed Jan. 28, 2009, the contents of each of which is incorporated herein by reference in its entirety.

TECHNICAL FIELD

The present invention relates to a prepreg, to a film with a resin, to a metal foil with a resin, to a metal-clad laminate and to a printed wiring board.

BACKGROUND ART

Miniaturization and downsizing of electronic devices continue to advance with the increasing rapid diffusion of data terminal electronic devices. Demands are concomitantly increasing for higher densities and smaller sizes for the printed circuit boards (printed wiring boards) mounted in such devices. The increasing functions of electronic devices such as cellular phones are also requiring connection between an ever greater variety of high performance modules or high-density printed circuit boards, including cameras and the like.

Such connecting materials, i.e flexible wiring board materials, must exhibit adhesion, heat resistance, flexibility, electrical insulating properties and long-term reliability. As electronic materials satisfying these demands, there have been used, specifically, resin compositions comprising curing agents added to acrylic-based resins such as acrylonitrile-butadiene-based resins or carboxy-containing acrylonitrile-butadiene resins (see Patent document 1, for example).

Acrylic-based resins have excellent features compared to other flexible resins, including (1) suitable tack strength, (2) easy introduction of functional groups and (3) transparency.

However, such resin compositions clearly have inferior ion migration resistance and insulating reliability. Ion migration is a phenomenon in which a metal composing the wiring or circuit pattern on an insulating material or inside an insulating material, or an electrode, migrates onto the insulating material or into the insulating material by differences in potential during electrification in a high humidity environment.

Ionic impurities are one cause of this phenomenon. In Patent document 2, a method of adding an inorganic ion exchanger is proposed as a countermeasure.

CITATION LIST

Patent Literature

[Patent document 1] Japanese Unexamined Patent Application Publication HEI No. 8-283535
[Patent document 2] Japanese Unexamined Patent Application Publication No. 2002-134907

SUMMARY OF INVENTION

Technical Problem

Nevertheless, it is difficult to obtain sufficient ion migration resistance by mere addition of an inorganic ion exchanger.

It is therefore an object of the present invention to provide a prepreg, a metal foil with a resin and a metal-clad laminate, that exhibit excellent bending resistance while also prevent ion migration and have excellent insulating reliability when printed wiring boards are fabricated, as well as a printed wiring board employing the same.

Solution to Problem

The invention provides a prepreg formed by impregnating a fiber base material with a resin composition, wherein the resin composition comprises an acrylic resin, and the ratio of the peak height near 2240 $cm^{-1}$ due to nitrile groups ($P_{CN}$) to the peak height near 1730 $cm^{-1}$ due to carbonyl groups ($P_{CO}$) in the IR spectrum of the cured resin composition ($P_{CN}/P_{CO}$) is no greater than 0.001 (first invention of prepreg).

The invention further provides a prepreg formed by impregnating a fiber base material with a resin composition, wherein the resin composition comprises an acrylic resin, the acrylic resin being an acrylic resin obtained by polymerizing a monomer mixture containing 5-30 parts by weight of a compound represented by the following formula (1), 0.5-30 parts by weight of a functional group-containing monomer, and 40-94.5 parts by weight of another monomer (monomer(s)) other than the aforementioned two components) that is copolymerizable with these components and has no nitrile groups in the structure, combined to a total amount of 100 parts by weight (second invention of prepreg).

[Chemical Formula 1]

[In the formula, $R^1$ represents a hydrogen atom or a methyl group and $R^2$ represents a C5-10 cycloalkyl, C6-13 cycloalkylalkyl, C6-10 aryl or C7-13 aralkyl group.]

According to the invention, a cycloalkylalkyl group is an alkyl group having one hydrogen atom replaced with a cycloalkyl group.

The invention further provides a metal foil with a resin, comprising a B-stage resin layer formed using a resin composition and a metal foil formed on at least one side of the resin layer, wherein the resin composition is a resin composition according to the first invention of prepreg.

The invention still further provides a film with a resin, comprising a B-stage resin film formed using a resin composition, formed on a support film, wherein the resin composition is a resin composition according to the first invention of prepreg.

The invention still further provides a metal foil with a resin, comprising a B-stage resin layer formed using a resin composition and a metal foil formed on at least one side of the resin layer, wherein the resin composition is a resin composition according to the second invention of prepreg.

The invention still further provides a film with a resin, comprising a B-stage resin film formed using a resin composition, formed on a support film, wherein the resin composition is a resin composition according to the second invention of prepreg.

The invention still further provides a metal-clad laminate comprising a substrate having a fiber base material embedded in a cured resin and a metal foil formed on at least one side of the substrate, wherein the cured resin is formed by curing a resin composition according to the first invention of prepreg.

The invention still further provides a metal-clad laminate comprising a substrate having a fiber base material embedded in a cured resin and a metal foil formed on at least one side of the substrate, wherein the cured resin is formed by curing a resin composition according to the second invention of prepreg.

The prepreg, film with a resin, metal foil with a resin and metal-clad laminate according to the invention exhibit excellent bending resistance while also prevent ion migration and have excellent insulating reliability when printed wiring boards are fabricated.

For the first invention of prepreg, and for a film with a resin, a metal foil with a resin and a metal-clad laminate employing a resin composition according to the invention (hereunder also referred to collectively as "the first invention"), the abundance of nitrile groups in the resin composition is expressed as the ratio of the peak height of carbonyl groups and the peak height of nitrile groups in the IR spectrum of the cured resin composition.

A $P_{CN}/P_{CO}$ ratio of no greater than 0.001 means that the resin composition contains substantially no nitrile groups, i.e. contains them only at an impurity level. According to the invention, the effect described above is obtained by this construction. If $P_{CN}/P_{CO}$ is greater than 0.001, the migration resistance, in particular, will be reduced.

The "cured resin composition" is the resin composition in a cured state up to the C-stage, and for example, it is the cured product of the resin composition that has been cured under conditions of 170° C., 90 minutes, 4.0 MPa. The "peak height near 1730 cm$^{-1}$ due to carbonyl groups ($P_{CO}$)" and the "peak height near 2240 cm$^{-1}$ due to nitrile groups ($P_{CN}$)" are the values determined by the IR measurement method described in the examples. The IR measurement is preferably accomplished by the KBr tablet method. Measurement by the ATR method tends to give smaller peaks at the high wavenumber end. Also, the "substrate having a fiber base material embedded in a cured resin" is generally a substrate in which the prepreg has been cured to the C-stage. However, unreacted functional groups may partially remain in the resin (composition), both in the cured product and in the substrate.

The acrylic resin is preferably an acrylic resin obtained by polymerizing a monomer mixture containing 5-30 parts by weight of a compound represented by the following formula (1), 0.5-30 parts by weight of a functional group-containing monomer, and 40-94.5 parts by weight of another monomer that is copolymerizable with these components and has no nitrile groups in the structure, combined to a total amount of 100 parts by weight. This will further improve the insulating reliability.

[Chemical Formula 2]

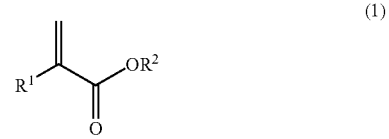

(1)

[In the formula, R$^1$ represents hydrogen or a methyl group and R$^2$ represents a C5-10 cycloalkyl, C6-13 cycloalkylalkyl, C6-10 aryl or C7-13 aralkyl group.]

Specific examples for the another monomer include monomers selected from among acrylic acid esters, methacrylic acid esters, aromatic vinyl compounds and N-substituted maleimides.

For the second invention of prepreg, and for a film with a resin, a metal foil with a resin and a metal-clad laminate employing a resin composition according to the invention (hereunder also referred to collectively as "the second invention"), the starting monomer for the acrylic resin is limited to one containing no nitrile groups, since this may be the main factor of the presence of nitrile groups in the resin composition.

In other words, there is provided a prepreg wherein the acrylic resin is an acrylic resin obtained by polymerizing a monomer mixture containing 5-30 parts by weight of a compound represented by the following formula (1), 0.5-30 parts by weight of a functional group-containing monomer, and 40-94.5 parts by weight of another monomer that is copolymerizable with these components and has no nitrile groups in the structure, combined to a total amount of 100 parts by weight.

[Chemical Formula 3]

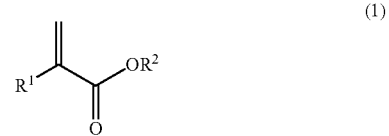

(1)

[In the formula, R$^1$ represents hydrogen or a methyl group and R$^2$ represents a C5-10 cycloalkyl, C6-13 cycloalkylalkyl, C6-10 aryl or C7-13 aralkyl group.]

For the first and second inventions, the acrylic resin is preferably an acrylic resin employing a methacrylic acid ester or acrylic acid ester having a C5-10 cycloalkyl group in the ester portion as a compound represented by the following formula (1), i.e. an acrylic resin obtained by polymerizing a monomer mixture containing 5-30 parts by weight of a methacrylic acid ester or acrylic acid ester having a C5-10 cycloalkyl group in the ester portion, 0.5-30 parts by weight of a functional group-containing monomer, and 40-94.5 parts by weight of another monomer that is copolymerizable with these components and has no nitrile groups in the structure, combined to a total amount of 100 parts by weight, as this will further improve the insulating reliability. The C5-10 cycloalkyl group preferably contains at least one group selected from the group consisting of cyclohexyl, norbornyl, tricyclodecanyl, isobornyl and adamantyl. This will still further improve the insulating reliability.

The weight-average molecular weight (Mw) of the acrylic resin according to the first and second inventions is preferably 50,000-1,500,000. This will allow a higher degree of adhesion and strength to be ensured.

The invention further provides a printed wiring board that employs at least a prepreg, a film with a resin, a metal foil with a resin or a metal-clad laminate according to the first or second invention. Such a printed wiring board exhibits excellent bending resistance while also prevents ion migration and has excellent insulating reliability.

Advantageous Effects of Invention

The prepreg, film with a resin, metal foil with a resin and metal-clad laminate according to the invention exhibit excellent bending resistance while also prevent ion migration and have excellent insulating reliability when printed wiring boards are fabricated. A printed wiring board of the invention exhibits excellent bending resistance while also prevents ion migration and has excellent insulating reliability.

DESCRIPTION OF EMBODIMENTS

Figure 1:
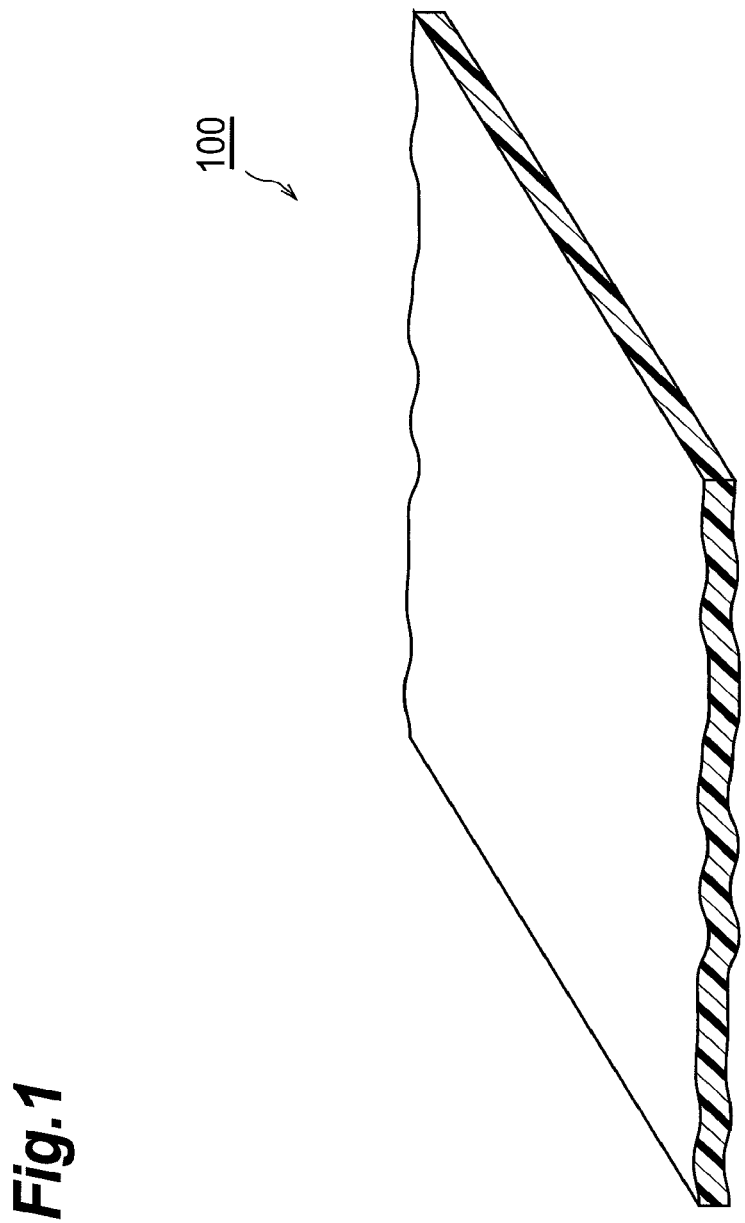
FIG. 1 is a perspective view of an embodiment of a prepreg according to the invention.

Embodiments of the invention will now be described in detail, with the understanding that the invention is not limited to the embodiments. Throughout the explanation of the drawings, identical or corresponding elements will be referred to by like reference numerals and will be explained only once.

FIG. 1 is a perspective view of an embodiment of a prepreg of the invention. The prepreg 100 of FIG. 1 is a sheet-like prepreg composed of a fiber base material and a resin composition impregnated in it. The thickness of the prepreg is preferably 20-100 μm, since a prepreg with a thickness in this range will have satisfactory flexibility.

The fiber base material in the prepreg 100 may be arbitrarily bendable, flexible fiber base material, and its thickness is preferably 10-80 μm.

The form of the fiber base material may be appropriately selected among forms commonly used for production of metal-clad laminates or multilayer printed wiring boards, but usually the fiber base material used will be a woven fabric or nonwoven fabric. The fibers composing the fiber base material may be inorganic fiber such as glass, alumina, boron, silica-alumina glass, silica glass, tyranno, silicon carbide, silicon nitride, zirconia or the like, or organic fiber such as aramid, polyetherketone, polyetherimide, polyethersulfone, carbon, cellulose or the like, or a mixed fiber sheet of the above. Glass fiber is preferred among the above. Particularly preferred as the fiber base material is glass cloth, which is a woven fabric made of glass fiber. The glass cloth used for the invention may be subjected to coupling treatment with an aminosilane, epoxysilane or the like if necessary, as surface treatment.

The resin composition of the invention preferably contains no nitrile groups, but it may contain a slight amount of nitrile groups as impurities, so long as the ratio of the peak height near 2240 $cm^{-1}$ due to nitrile groups ($P_{CN}$) to the peak height near 1730 $cm^{-1}$ due to carbonyl groups ($P_{CO}$) in the IR spectrum of the cured resin composition ($P_{CN}/P_{CO}$) is no greater than 0.001. This ratio can be determined by transmission IR spectrum measurement of the cured resin composition. The carbonyl group is a characteristic functional group of the acrylic resin present as an essential component in the resin composition, and the carbonyl group (—CO) peak height is used as the standard for specifying the amount of nitrile groups.

The resin composition comprises an acrylic resin. As acrylic resins there may be used polymers obtained by polymerization of an acrylic acid ester or methacrylic acid ester alone, or copolymers obtained by copolymerization of acrylic acid esters, methacrylic acid esters, functional group-containing monomers or monomer mixtures of these components with monomers that are copolymerizable therewith. The monomers in a monomer mixture preferably contain no nitrile groups, in order to more effectively prevent ion migration, while in order to further improve the insulating reliability they preferably contain no nitrogen atoms, and most preferably comprise only carbon, hydrogen and oxygen atoms.

The acrylic resin preferably contains no nitrile groups, and more preferably it is an acrylic resin obtained by polymerizing a monomer mixture containing 5-30 parts by weight of a compound represented by the following formula (1), 0.5-30 parts by weight of a functional group-containing monomer, and 40-94.5 parts by weight of monomer(s) (monomer(s) other than the aforementioned two components) that is copolymerizable with them, combined to a total amount of 100 parts by weight. The amount of the compound represented by formula (1) below is more preferably 10-30 parts by weight, from the viewpoint of hygroscopicity.

[Chemical Formula 4]

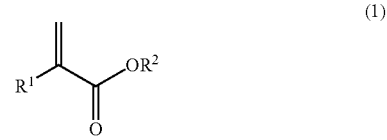

(1)

Here, $R^1$ represents a hydrogen atom or a methyl group, and $R^2$ represents a C5-10 cycloalkyl, C6-13 cycloalkylalkyl, C6-10 aryl or C7-13 aralkyl group, and preferably a C5-10 cycloalkyl or C7-13 aralkyl group.

Examples of C5-10 cycloalkyl groups for $R^2$ include cyclohexyl, norbornyl, tricyclodecanyl, isobornyl and adamantyl, with tricyclodecanyl being preferred from the viewpoint of low hygroscopicity.

Examples of C6-13 cycloalkylalkyl groups for $R^2$ include C1-3 alkyl groups wherein one hydrogen atom has been replaced with one of the aforementioned C5-10 cycloalkyl groups. Specific examples include cyclohexylmethyl, cyclohexylethyl, cyclohexylpropyl, norbornylmethyl, tricyclodecanylmethyl, isobornylmethyl and adamantylmethyl.

Examples of C6-10 aryl groups for $R^2$ include phenyl and naphthyl.

Examples of C7-13 aralkyl groups for $R^2$ include C1-3 alkyl groups wherein one hydrogen atom has been replaced with one of the aforementioned C6-10 aryl groups. Specific examples include benzyl, phenethyl and naphthylmethyl, with benzyl being particularly preferred from the viewpoint of low hygroscopicity.

The acrylic resin is more preferably one employing a methacrylic acid ester or acrylic acid ester having a C5-10 cycloalkyl group in the ester portion (hereunder also referred to as "alicyclic monomer") as a compound represented by the following formula (1), i.e. an acrylic resin obtained by polymerizing a monomer mixture containing 5-30 parts by weight of a methacrylic acid ester or acrylic acid ester having a C5-10 cycloalkyl group in the ester portion, 0.5-30 parts by weight of a functional group-containing monomer, and 40-94.5 parts by weight of a monomer (other than the aforementioned components) that is copolymerizable with these components combined to a total amount of 100 parts by weight. The alicyclic monomer content is more preferably 10-30 parts by weight from the viewpoint of hygroscopicity.

If the alicyclic monomer content is less than 5 parts by weight the hygroscopicity will tend to be increased, and if it is greater than 30 parts by weight the mechanical strength will tend to be reduced. If the functional group-containing monomer content is less than 0.5 part by weight the adhesion will tend to be reduced and the strength lowered, while if it is greater than 30 parts by weight, crosslinking reaction will tend to occur during copolymerization and the storage stability will tend to be impaired.

A C5-10 cycloalkyl group as the alicyclic monomer is preferably a methacrylic acid ester or acrylic acid ester containing at least one group selected from the group consisting of cyclohexyl, norbornyl, tricyclodecanyl, isobornyl and adamantyl groups. Specific examples of alicyclic monomers include cyclopentyl acrylate, cyclohexyl acrylate, methylcyclohexyl acrylate, norbornyl acrylate, norbornylmethyl acrylate, phenylnorbornyl acrylate, isobornyl acrylate, bornyl acrylate, menthyl acrylate, fenchyl acrylate, adamantyl acrylate, tricyclo[5.2.1.0$^{2,6}$]deca-8-yl acrylate, tricyclo[5.2.1.0$^{2,6}$]deca-4-methyl acrylate, cyclodecyl acrylate, cyclopentyl methacrylate, cyclohexyl methacrylate, methylcyclohexyl methacrylate, trimethylcyclohexyl methacrylate, norbornyl methacrylate, norbornylmethyl methacrylate, phenylnorbornyl methacrylate, isobornyl methacrylate, menthyl methacrylate, adamantyl methacrylate, tricyclo[5.2.1.0$^{2,6}$]deca-8-yl methacrylate, tricyclo[5.2.1.0$^{2,6}$]deca-4-methyl methacrylate and cyclodecyl methacrylate. Any of these may be used alone or in mixtures of two or more. Mixtures of methacrylic acid esters and acrylic acid esters may also be used as alicyclic monomers.

Preferred among these, from the viewpoint of low hygroscopicity, are cyclohexyl acrylate, isobornyl acrylate, norbornylmethyl acrylate, tricyclo[5.2.1.0$^{2,6}$]deca-8-yl acrylate, tricyclo[5.2.1.0$^{2,6}$]deca-4-methyl acrylate, adamantyl acrylate, cyclopentyl methacrylate, cyclohexyl methacrylate, methylcyclohexyl methacrylate, tricyclohexyl methacrylate, norbornyl methacrylate, norbornylmethyl methacrylate, isobornyl methacrylate, bornyl methacrylate, menthyl methacrylate, adamantyl methacrylate, tricyclo[5.2.1.0$^{2,6}$]deca-8-yl methacrylate, tricyclo[5.2.1.0$^{2,6}$]deca-4-methyl methacrylate and cyclodecyl methacrylate.

Particularly preferred from the viewpoint of low hygroscopicity and adhesion are cyclohexyl acrylate, isobornyl acrylate, norbornyl acrylate, tricyclohexyl[5.2.1.0$^{2,6}$]deca-8-yl acrylate, tricyclohexyl[5.2.1.0$^{2,6}$]deca-4-methyl acrylate and adamantyl acrylate.

The alicyclic monomer in this case is preferably one with no nitrile groups in the structure.

A functional group-containing monomer is a group having a functional group and at least one polymerizable carbon-carbon double bond in the molecule, and preferably having as the functional group at least one functional group selected from the group consisting of carboxyl, hydroxyl, acid anhydride, amino, amide and epoxy groups. Specific examples of functional group-containing monomers include carboxyl group-containing monomers such as acrylic acid, methacrylic acid and itaconic acid, hydroxyl group-containing monomers such as 2-hydroxyethyl acrylate, 2-hydroxyethyl methacrylate, 2-hydroxypropyl acrylate, 2-hydroxypropyl methacrylate, N-methylolmethacrylamide and (o-, m-, p-)hydroxystyrene, acid anhydride group-containing monomers such as maleic anhydride, amino group-containing monomers such as diethylaminoethyl acrylate and diethylaminoethyl methacrylate, epoxy group-containing monomers such as glycidyl acrylate, glycidyl methacrylate, glycidyl α-ethylacrylate, glycidyl α-n-propylacrylate, 3,4-epoxybutyl acrylate, 3,4-epoxybutyl methacrylate, 4,5-epoxypentyl acrylate, 6,7-epoxyheptyl acrylate, 6,7-epoxyheptyl methacrylate, 3-methyl-4-epoxybutyl acrylate, 3-methyl-3,4-epoxybutyl methacrylate, 4-methyl-4,5-epoxypentyl acrylate, 4-methyl-4,5-epoxypentyl methacrylate, 5-methyl-5,6-epoxyhexyl acrylate, β-methylglycidyl acrylate, β-methylglycidyl methacrylate, β-methylglycidyl α-ethylacrylate, 3-methyl-3,4-epoxybutyl acrylate, 3-methyl-3,4-epoxybutyl methacrylate, 4-methyl-4,5-epoxypentyl acrylate, 4-methyl-4,5-epoxypentyl methacrylate, 5-methyl-6-epoxyhexyl acrylate and 5-methyl-5,6-epoxyhexyl methacrylate, and acrylamides, methacrylamides, dimethylacrylamides, dimethylmethacrylamides, and the like. Any of these may be used alone or in mixtures of two or more. The functional group-containing monomer in this case is preferably one with no nitrile groups in the structure.

Epoxy group-containing monomers are preferred among the above from the viewpoint of storage stability, while acrylic acid esters or methacrylic acid esters with glycidyl groups are preferred, and glycidyl acrylate and glycidyl methacrylate are especially preferred, from the viewpoint of increased heat resistance by reaction with crosslinking components other than the acrylic resin.

The monomer that is copolymerizable with the aforementioned components is not particularly restricted so long as it does not basically impair the low hygroscopicity, heat resistance and stability of the polymer, but it preferably has no nitrile groups in the structure. Specific examples of monomers that are copolymerizable with the aforementioned components include acrylic acid esters including alkyl acrylate esters such as methyl acrylate, ethyl acrylate, n-propyl acrylate, i-propyl acrylate, n-butyl acrylate, i-butyl acrylate, t-butyl acrylate, pentyl acrylate, n-hexyl acrylate, 2-ethylhexyl acrylate, n-octyl acrylate, dodecyl acrylate and octadecyl acrylate, and alkoxyalkyl acrylates such as butoxyethyl acrylate, methacrylic acid esters including alkyl methacrylate esters such as methyl methacrylate, ethyl methacrylate, n-propyl methacrylate, i-propyl methacrylate, n-butyl methacrylate, i-butyl methacrylate, t-butyl methacrylate, pentyl methacrylate, n-hexyl methacrylate, 2-ethylhexyl methacrylate, n-octyl methacrylate, lauryl methacrylate, dodecyl methacrylate and octadecyl methacrylate and alkoxyalkyl methacrylates such as butoxyethyl methacrylate, aromatic vinyl compounds such as 4-vinylpyridine, 2-vinylpyridine, α-methylstyrene, α-ethylstyrene, α-fluorostyrene, α-chlorostyrene, α-bromostyrene, fluorostyrene, chlorostyrene, bromostyrene, methylstyrene, methoxystyrene and styrene, and N-substituted maleimides such as N-methylmaleimide, N-ethylmaleimide, N-propylmaleimide, N-i-propylmaleimide, N-butylmaleimide, N-i-butylmaleimide, N-t-butylmaleimide, N-laurylmaleimide, N-cyclohexylmaleimide, N-benzylmaleimide and N-phenylmaleimide. Any of these may be used alone or in mixtures of two or more.

Among these, alkyl acrylate esters or alkyl methacrylate esters are preferred, and methyl acrylate, ethyl acrylate and n-butyl acrylate are more preferred.

The mixing ratio of the acrylic resin is preferably 10-90 wt % and more preferably 15-70 wt %, with respect to the total solid portion of the resin composition (i.e. the total amount of components other than the solvent). If it is less than 10 wt % the bendability will tend to be reduced, and if it is greater than 90 wt % the flame retardance will tend to be reduced.

The polymerization method used for production of the acrylic resin may be a known method such as bulk polymerization, suspension polymerization, solution polymerization, precipitation polymerization or emulsion polymerization. Suspension polymerization is most preferred from the standpoint of cost.

Suspension polymerization is conducted with addition of a suspending agent in an aqueous medium. The suspending agent may be a water-soluble polymer such as polyvinyl alcohol, methylcellulose or polyacrylamide, or a hardly-soluble inorganic material such as calcium phosphate or magnesium pyrophosphate, among which nonionic water-soluble polymers such as polyvinyl alcohol are preferred. When an ionic water-soluble polymer or hardly-soluble inorganic material is used, numerous ionic impurities will tend to remain in the obtained elastomer. The water-soluble polymer is preferably used at 0.01-1 parts by weight with respect to 100 parts by weight as the total monomer mixture.

A radical polymerization initiator may be used for the polymerization. The radical polymerization initiator used may be any one that can normally be used for radical polymerization, including an organic peroxide such as benzoyl peroxide, lauroyl peroxide, di-t-butylperoxy hexahydroterephthalate, t-butylperoxy-2-ethyl hexanoate, 1,1-t-butylperoxy-3,3,5-trimethylcyclohexane or t-butylperoxyisopropyl carbonate, an azo compound such as azobisisobutyronitrile, azobis-4-methoxy-2,4-dimethylvaleronitrile, azobiscyclohexanone-1-carbonitrile or azodibenzoyl, a water-soluble catalyst such as potassium persulfate or ammonium persulfate, or a redox catalyst obtained by combining a peroxide or a persulfuric acid salt with a reducing agent. The polymerization initiator is preferably used in a range of 0.01-10 parts by weight with respect to 100 parts by weight as the total of the monomer mixture.

A mercaptan-based compound, thioglycol, carbon tetrachloride, α-methylstyrene dimer or the like may be added as a molecular weight modifier, if necessary during the polymerization.

When the polymerization is thermal polymerization, the polymerization temperature may be appropriately set between 0-200° C., and preferably 40-120° C.

The molecular weight of the acrylic resin is not particularly restricted, but the weight-average molecular weight (standard polystyrene conversion according to gel permeation chromatography) is preferably in the range of 10,000-2,000,000 and most preferably in the range of 100,000-1,500,000. If the weight-average molecular weight is less than 10,000 the adhesion and strength will tend to be reduced, and if it is greater than 2,000,000 the solubility in solvents will tend to be lowered and the workability will tend to be impaired.

The resin composition preferably further comprises a thermosetting resin and a curing agent.

The resin composition preferably contains no components with nitrile groups in the composition.

The thermosetting resin is preferably a resin with a glycidyl group, and also preferably comprises a high molecular weight resin component for the purpose of improving flexibility and heat resistance. Examples of thermosetting resins to be used include epoxy resin-based, polyimide resin-based, polyamideimide resin-based, triazine resin-based, phenol resin-based, melamine resin-based, polyester resin-based and cyanate ester resin-based substances, as well as modified forms of these resins. These resins may be used in combinations of two or more, and if necessary they may be used as solutions in various solvents.

Such solvents may be alcohol-based, ether-based, ketone-based, amide-based, aromatic hydrocarbon-based, ester-based or nitrile-based solvents, and mixed solvents comprising several different types may also be used. However, a system of the same solvent is preferred since the same solvent will allow more satisfactory adhesion within the resin.

Epoxy resins include polyglycidyl ethers obtained by reaction between epichlorohydrin and polyvalent phenols such as bisphenol A, biphenylnovolac-type epoxy resin, naphthalene-type epoxy resin, novolac-type phenol resin and orthocresol-novolac-type phenol resin, or polyhydric alcohols such as 1,4-butanediol, polyglycidyl esters obtained by reaction between epichlorohydrin and polybasic acids such as phthalic acid or hexahydrophthalic acid, N-glycidyl derivatives of compounds with amine, amide or heterocyclic nitrogen base, and alicyclic epoxy resins.

The curing agent used may be any of those known in the prior art, and when an epoxy resin is used as the resin, for example, it may be a dicyandiamide, diaminodiphenylmethane, diaminodiphenylsulfone, phthalic anhydride or pyromellitic anhydride, or a polyfunctional phenol such as phenol-novolac or cresol-novolac, a naphthalene-type phenol resin or triazine ring-containing cresol-novolac. The curing agent content will differ depending on the type of curing agent, but in the case of an amine it is preferably an amount such that the amine active hydrogen equivalents and the epoxy equivalents of the epoxy resin are approximately equal, and in terms of amount it is generally preferred to be about 0.001-10 parts by weight with respect to 100 parts by weight of the epoxy resin. For a polyfunctional phenol or acid anhydride during curing, the amount is preferably 0.6-1.2 equivalents of its phenolic hydroxyl or carboxyl groups per equivalent of the epoxy resin.

An accelerator will often be used to promote reaction between the resin and curing agent. There are no particular restrictions on the type and amount of accelerator, and for example, an imidazole-based compound, organic phosphorus-based compound, tertiary amine, quaternary ammonium salt, blocked isocyanate or the like may be used, even in combinations of two or more.

The mixing ratio of the thermosetting resin is preferably 5-90 wt % and more preferably 10-60 wt %, with respect to the total solid portion of the resin composition. The mixing ratio of the curing agent is preferably 1-95 wt % and more preferably 1-30 wt %, with respect to the total solid portion of the resin composition.

The resin composition may also contain a flame retardant, flow adjuster, coupling agent, antioxidant or the like.

The prepreg 100 is obtained, for example, by using the aforementioned resin composition for dipping or coating of the fiber base material, allowing impregnation to occur, and drying it.

There are no particular restrictions on the conditions for fabrication of the prepreg 100, but when a solvent solution (varnish) is used, drying is preferably performed at least at a temperature allowing volatilization of the solvent, with volatilization of at least 80 wt % of the solvent used in the varnish. Thus, the drying temperature is preferably 80° C.–180° C., and the varnish impregnation content is preferably such for a varnish solid portion of 30-80 wt % with respect to the total of the varnish solid portion and base material.

Such solvents may be alcohol-based, ether-based, ketone-based, amide-based, aromatic hydrocarbon-based, ester-based or nitrile-based solvents, and mixed solvents comprising several types may also be used.

Figure 2:
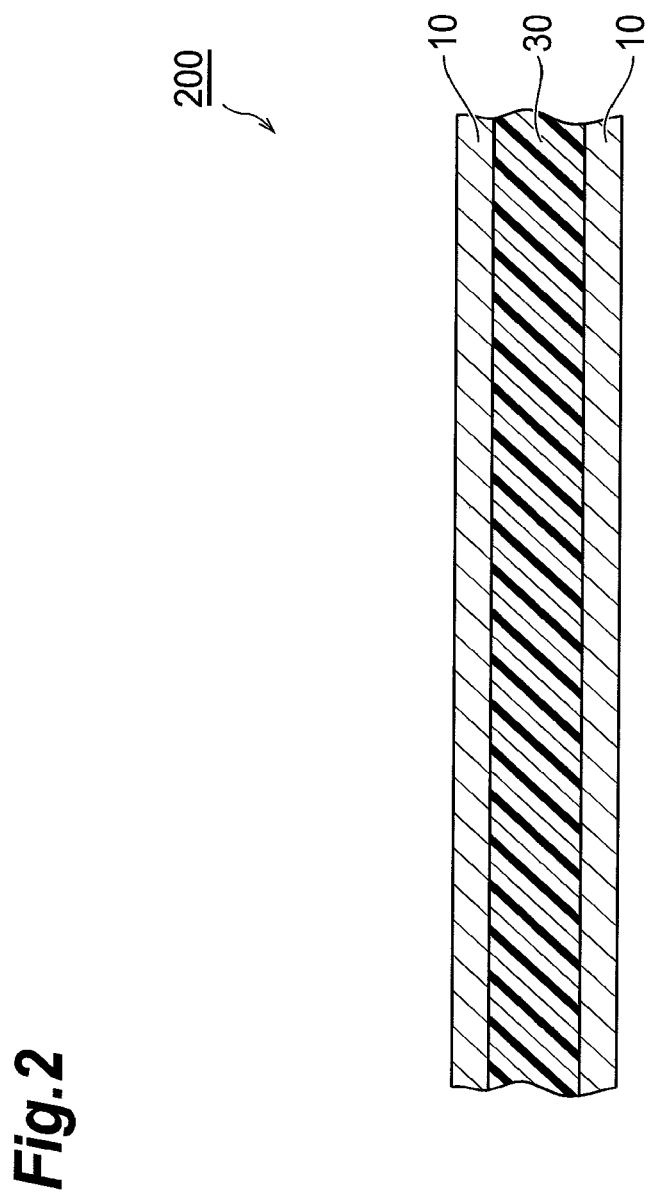
FIG. 2 is a partial cross-sectional view of an embodiment of a metal-clad laminate according to the invention.

FIG. 2 is a partial cross-sectional view of an embodiment of a metal-clad laminate according to the invention. The metal-clad laminate 200 shown in FIG. 2 comprises a substrate 30 composed of a single prepreg 100, and two metal foils 10 formed in a bonded manner on either side of the substrate 30.

The metal-clad laminate 200 is obtained, for example, by stacking the metal foils onto either side of the prepreg 100, and heating and pressing them. The heating and pressing conditions are not particularly restricted, but will usually be a molding temperature of 80° C.–250° C. and a molding pressure of 0.5 MPa-8.0 MPa, and preferably a molding temperature of 130° C.–230° C. and a molding pressure of 1.5 MPa-5.0 MPa.

The thickness of the metal-clad laminate 200 is preferably no greater than 200 μm and more preferably 20-180 μm. If the thickness is greater than 200 μm, the flexibility may be reduced and cracking may tend to occur more easily during bending. Also, metal-clad laminates with thicknesses of less than 20 μm are extremely difficult to produce.

Examples of commonly used metal foils include copper foil, aluminum foil and nickel foil, but copper foil is preferred for the metal-clad laminate of this embodiment. For increased flexibility of the metal foil with a resin, the thickness is preferably 0.01 μm-35 μm, and the bending performance is improved by using a copper foil with a thickness of 20 μm or smaller. Examples of copper foils with such thicknesses include electrolytic copper foils and rolled copper foils.

The method of stacking, heating and pressing the prepreg and metal foil may be a press lamination method or heated roll continuous lamination method, with no particular restrictions. For this embodiment, hot press lamination in a vacuum is preferred from the viewpoint of efficiently forming a metal-clad laminate.

A heated roll continuous lamination method, in which continuous lamination of a prepreg and metal foil is carried out through the spacing between heated rolls and laterally conveyed to a continuous thermosetting furnace for curing followed by take-up, is a preferred method as a countermeasure against wrinkles, folds and the like caused by cure shrinkage of the viscoelastic resin composition during curing. In some cases, the curing and take-up may be followed by post-heat treatment for a prescribed period of time for more stable quality.

Embodiments of the metal-clad laminate are not limited to the mode described above. For example, multiple prepregs 100 may be used to form the substrate as a multilayer fiber-reinforced resin layer, or the metal foil may be formed on only one side of the substrate.

Figure 3:
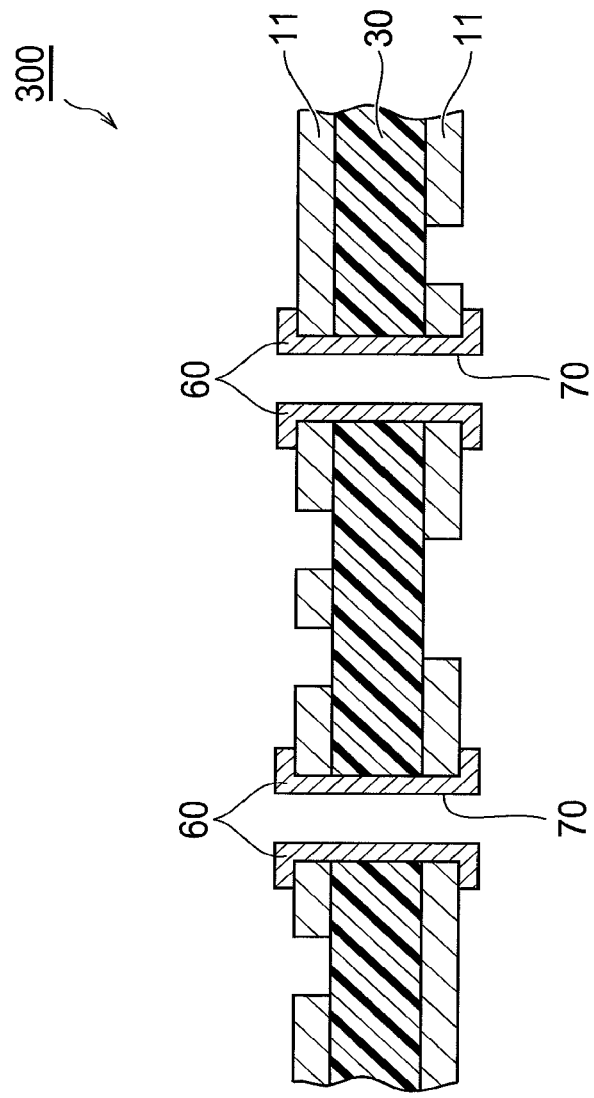
FIG. 3 is a partial cross-sectional view of an embodiment of a printed wiring board of the invention, obtained by forming a wiring pattern on a metal-clad laminate.

FIG. 3 is a partial cross-sectional view of an embodiment of a printed wiring board of the invention, obtained by forming a wiring pattern on the aforementioned metal-clad laminate 200. The printed wiring board 300 shown in FIG. 3 is composed mainly of the substrate 30 and a wiring pattern 11 formed of a patterned metal foil provided on both sides of the substrate 30. Also, a plurality of through-holes 70 are formed running through the substrate 30 in a direction roughly perpendicular to its main side, and metal-plated layers 60 of a prescribed thickness are formed on the hole walls of the through-holes 70. The printed wiring board 300 is obtained by forming a wiring pattern on the metal foil 10. The wiring pattern formation may be accomplished by a process known in the prior art, such as a subtractive process. The printed wiring board 300 can be suitably used as a bendable printed wiring board or rigid-flexible wiring board.

A multilayer wiring board can be obtained by laminating the resin film side of the metal foil with a resin described hereunder in a manner facing the wiring-formed side of the aforementioned printed wiring board, or by stacking the film with a resin described hereunder and the metal foil and laminating them on the wiring-formed side of the aforementioned printed wiring board.

The metal foil with a resin of this embodiment comprises a B-stage resin film made of the resin composition described above, and a metal foil formed on at least one side of the resin film. Examples of commonly used metal foils include copper foil, aluminum foil and nickel foil, but copper foil is preferred for the metal foil with a resin of this embodiment. For increased flexibility of the metal foil with a resin, the thickness is preferably 0.01 μm-35 μm, and the bending performance is improved by using a copper foil with a thickness of 20 μm or smaller. The thickness of the resin film is preferably 5-90 μm. A resin film thickness of 5-90 μm will allow satisfactory flexibility to be ensured.

The film with a resin of this embodiment has a B-stage resin film made of the resin composition described above, provided on a support film. A multilayer wiring board can be obtained by transferring the resin film of the film with a resin onto the wiring-formed side of a printed wiring board, releasing the support film, and stacking the metal foil or printed wiring board, and heating and pressing, and the resin film of the film with a resin exhibits similar properties to those of the resin film of a metal foil with a resin. Polyethylene terephthalate or the like is preferably used as the support film.

EXAMPLES

The invention will now be described by examples, with the understanding that it is not limited to the examples.

Example 1

295 g of tricyclo[$5.2.1.0^{2,6}$]deca-8-yl acrylate (product of Hitachi Chemical Co., Ltd., FA-513AS, see formula (A) below), 288 g of ethyl acrylate (EA), 387 g of n-butyl acrylate (BA) and 30 g of glycidyl methacrylate (GMA) are mixed to obtain monomer mixture A. To the obtained mixture A, 2 g of lauroyl peroxide and 0.16 g of n-octylmercaptane were further dissolved, to obtain monomer mixture B.

[Chemical Formula 5]

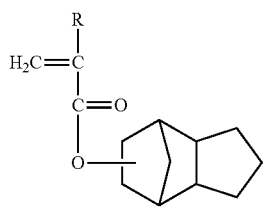

(A)

[R=H; product name: FA-513AS, R=CH$_3$; product name: FA-513MS]

Into a 5 L autoclave equipped with a stirrer and condenser there were added 0.04 g of polyvinyl alcohol as a suspending agent and 2000 g of ion-exchanged water, and then monomer mixture B was added while stirring and the mixture was stirred at 250 rpm under a nitrogen atmosphere, at 60° C. for 2 hours, and polymerization was conducted at 100° C. for 1 hour to obtain resin particles (polymerization rate: 99% by weighing). The resin particles were rinsed, dehydrated and dried and then dissolved in methyl isobutyl ketone to a heating residue of 25 wt % to obtain acrylic resin A.

A resin composition composed of the components listed in Table 1 was then dissolved in methyl ethyl ketone and methyl isobutyl ketone, and the resin solid content was adjusted to 30 wt % to prepare a thermosetting resin varnish.

TABLE 1

| Component | Content (parts by wt.) |
|---|---|
| Biphenyl novolac epoxy resin (NC-3000H: Nippon Kayaku Co., Ltd.) | 35 |
| Triazine ring-containing cresol-novolac type phenol resin (PHENOLITE LA-3018, trade name of DIC, as solid resin portion) | 13 |
| Blocked isocyanate (G-8009L: product of JER) | 0.2 |
| Acrylic resin (as solid resin portion) | 40 |
| OP930 (trade name of Clariant, Japan) | 12 |
| Oxidation inhibitor (YOSHINOX BB) | 0.5 |
| Total | 100.7 |

Examples 2-12, Examples 22-34 and Comparative Examples 1-3

Thermosetting resin varnishes were prepared in the same manner as Example 1, except for using monomer mixtures A having the compositional ratios listed in Tables 2-8.

Example 13

A thermosetting resin varnish was prepared in the same manner as Example 1, except that acrylic resin B prepared by the method described below was used instead of acrylic resin A.

In a 1 L-volume flask there were placed 285 g of tricyclo [5.2.1.0$^{2,6}$]deca-8-yl acrylate (FA-513AS, product of Hitachi Chemical Co., Ltd.), 280 g of ethyl acrylate (EA), 385 g of n-butyl acrylate (BA), 50 g of glycidyl methacrylate (GMA), 400 g of methyl isobutyl ketone and 0.1 g of azobisisobutyronitrile, and the components were mixed for 60 minutes under a nitrogen atmosphere. The mixture was then heated at 80° C. for 30 minutes, and polymerization was conducted for 3 hours to synthesize acrylic resin B.

Example 14

A thermosetting resin varnish was prepared in the same manner as Example 1, except that acrylic resin C synthesized by the method described below was used instead of acrylic resin A.

In a 1 L-volume flask there were placed 285 g of tricyclo [5.2.1.0$^{2,6}$]deca-8-yl acrylate (FA-513AS, product of Hitachi Chemical Co., Ltd.), 280 g of ethyl acrylate (EA), 385 g of n-butyl acrylate (BA), 50 g of glycidyl methacrylate (GMA), 150 g of methyl isobutyl ketone and 0.1 g of azobisisobutyronitrile, and the components were mixed for 60 minutes under a nitrogen atmosphere. The mixture was then heated at 80° C. for 30 minutes, and polymerization was conducted for 3 hours to synthesize acrylic resin C.

Examples 15-21

Thermosetting resin varnishes were prepared in the same manner as Example 1, except for using the monomer mixtures A having the compositional ratios listed in Tables 4 and 5, and mixing the components in the compositional ratios of the resin compositions listed in Tables 4 and 5.

Example 35

A resin composition composed of the components listed in Table 9, using an acrylic resin with the same composition as used in Example 34, was dissolved in methyl ethyl ketone and methyl isobutyl ketone, and the resin solid content was adjusted to 30 wt % to prepare a thermosetting resin varnish.

Example 36

A resin composition composed of the components listed in Table 10, using an acrylic resin with the same composition as used in Example 34, was dissolved in methyl ethyl ketone and methyl isobutyl ketone, and the resin solid content was adjusted to 30 wt % to prepare a thermosetting resin varnish.

Example 37

An acrylic resin was synthesized by the same method as in Example 1 using a monomer mixture A having the compositional ratio listed in Table 8, a resin composition composed of the components listed in Table 11 was dissolved in methyl ethyl ketone and methyl isobutyl ketone, and the resin solid content was adjusted to 30 wt % to prepare a thermosetting resin varnish.

Comparative Example 4

A thermosetting resin varnish was prepared in the same manner as Example 37, except for using an acrylic resin having the same composition as that used in Comparative Example 2.

Comparative Example 5

A thermosetting resin varnish was prepared in the same manner as Example 37, except that the acrylic resin was synthesized by mixing the components in the mixing ratios listed in Table 8.

The thermosetting resin varnishes obtained in Examples 1-37 and Comparative Examples 1-5 were evaluated by the methods described below. The results are shown in Tables 2 to 8.
(Weight-Average Molecular Weight (Mw))

The weight-average molecular weight was measured by gel permeation chromatography (eluent: tetrahydrofuran, column: Gelpack GL-A100M by Hitachi Chemical Co., Ltd., standard polystyrene conversion).
(Fabrication of Copper Foil with Resin)

A copper foil with a thickness of 18 μm (HLA18 by Nippon Denkai Co., Ltd.) was coated with each of the thermosetting resin varnishes prepared in Examples 1-37 and Comparative Examples 1-5 to a dried resin thickness of 60 μm using a horizontal coating machine, and then heated and dried in a drying furnace at 80-140° C. with a residence time of 5-15 minutes, to obtain a copper foil with a resin.
(Fabrication of Film with Resin)

A polyethylene terephthalate (PET) film with a thickness of 70 μm (PUREX A70-25 by Teijin-DuPont Films) was coated with each of the varnishes prepared in Examples 1-37 and Comparative Examples 1-5 to a dried resin thickness of 60 μm using a horizontal coating machine, and then heated and dried in a drying furnace at 80-140° C. with a residence time of 5-15 minutes, to obtain a film with a resin.
(Fabrication of Prepreg)

A prepreg was obtained by coating a prepared varnish onto a glass cloth WEX-1027 (product of Asahi Shwebel, thickness: 19 μm) to a dried prepreg thickness of 55 μm-65 μm using a vertical coating machine, and then heat-drying it at 120-150° C. for 20 minutes.
(Fabrication of Evaluation Substrate)

An electrode-attached comb pattern circuit (circuit thickness: 9 μm) with a line width of 50 μm and an interline spacing of 50 μm was formed by etching on one side of a 0.3 mm-thick double-sided copper-clad laminate (MCL-E-679F by Hitachi Chemical Co., Ltd.), while the entire opposite surface was etched. The resin side of the copper foil with a resin, or the prepreg and copper foil, or the film with a resin and the copper foil, were attached to the electrode-attached comb pattern circuit-formed side of the substrate, laminated and pressed under pressing conditions of 170° C., 90 minutes, 4.0 MPa, after which the outer layer copper foil was etched and the laminate was used as the evaluation substrate.

For the evaluation substrate for evaluation of the insulating reliability of the acrylic resin alone, described hereunder, the electrode-attached comb pattern circuit-formed side was coated with an acrylic resin to a post-drying thickness of at least 60 μm using an applicator, to fabricate an evaluation substrate. Specifically, the drying was conducted under conditions of 80° C./10 min and then 135° C./10 min.

(IR Measurement)

The resin of the evaluation substrate was chipped off and the transmission IR spectrum was measured by the KBr tablet method and displayed with absorbance on the ordinate. The IR measurement was conducted using a FT-IR6300 by JASCO Corp. (light source: high luminance ceramic light source, detector: DLATGS). The measurement resolution was 4.
(Peak Height Near 2240 cm$^{-1}$ Due to Nitrile Groups ($P_{CN}$))

The peak The peak point was defined as the point of the highest absorbance peak between the two points at 2270 cm$^{-1}$ and 2220 cm$^{-1}$. Using the straight line between the two points of absorbance at 2270 cm$^{-1}$ and 2220 cm$^{-1}$ as the baseline, the difference in absorbance between the peak point and the point at the same wavenumber as the peak point on this baseline was recorded as the peak height due to nitrile groups ($P_{CN}$).
(Peak Height Near 1730 cm$^{-1}$ Due to Carbonyl Groups ($P_{CO}$))

The peak point was defined as the point of the highest absorbance peak between the two points at 1670 cm$^{-1}$ and 1860 cm$^{-1}$. Using the straight line between the two points of absorbance at 1670 cm$^{-1}$ and 1860 cm$^{-1}$ as the baseline, the difference in absorbance between the peak point and the point at the same wavenumber as the peak point on this baseline was recorded as the peak height due to carbonyl groups ($P_{CO}$).

Figure 4:
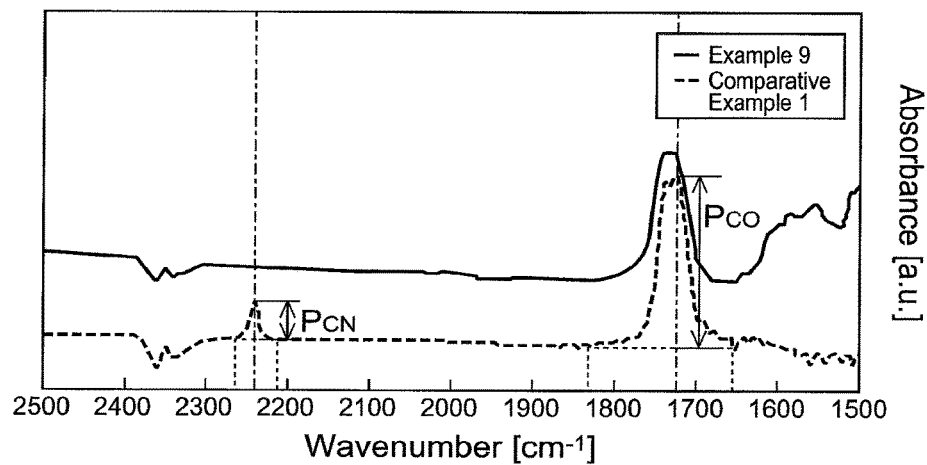
FIG. 4 shows the IR spectrum measurement results for Example 9 and Comparative Example 1.

FIG. 4 shows the IR spectrum measurement results for Example 9 and Comparative Example 1. The absorbance is plotted on the ordinate, and the wavenumber on the abscissa. As clearly seen in the graph, no peak due to nitrile groups was observed in the IR spectrum of Example 9. The peak height was recorded as 0 when no peak could be confirmed.
(Insulating Reliability Evaluation)

For the evaluation substrate, the resin was removed from the electrode of the electrode-attached comb pattern circuit for connection between the electrode and an ion migration tester, and the resistance value was continuously measured in a thermostatic bath adjusted to a temperature of 85° C. and a humidity of 85%. The application/measuring voltage was 50 V. The ion migration tester used was a MIG-87C (trade name of IMV Corp.). The sample was placed in a thermostatic bath, and the voltage was applied 3 hrs after reaching a temperature of 85° C. and a humidity of 85%.

Figure 5:
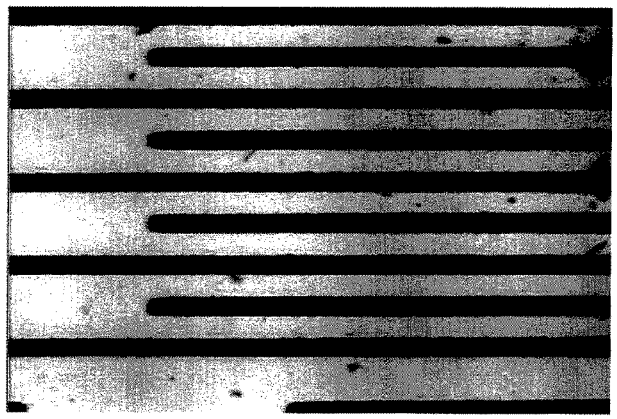
FIG. 5 is a photomicrograph of the electrode section of the evaluation substrate of Example 1 after a 120-hr insulating reliability evaluation test.

The state of ion migration was observed with a microscope, 120 hrs and 1000 hrs after the 85° C./85% test. FIG. 5 is a photomicrograph of the electrode section after a 120-hr insulating reliability evaluation test of the evaluation substrate of Example 1, FIG. 6 is a photomicrograph of the electrode section after a 120-hr insulating reliability evaluation test of the evaluation substrate of Comparative Example 1, and FIG. 7 is a photomicrograph of the electrode section after a 120-hr insulating reliability evaluation test of the evaluation substrate of Comparative Example 2.

Figure 6:
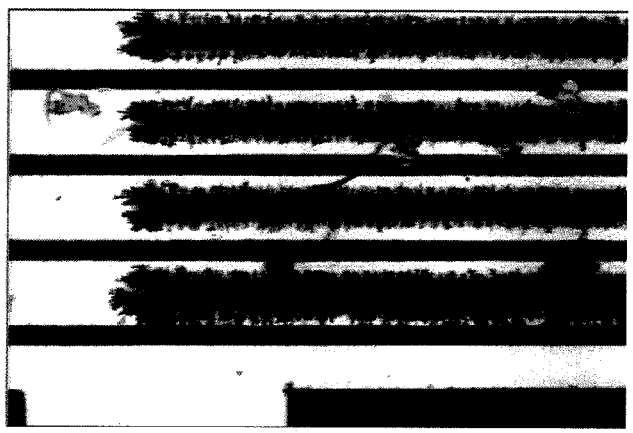
FIG. 6 is a photomicrograph of the electrode section of the evaluation substrate of Comparative Example 1 after a 120-hr insulating reliability evaluation test.
Figure 7:
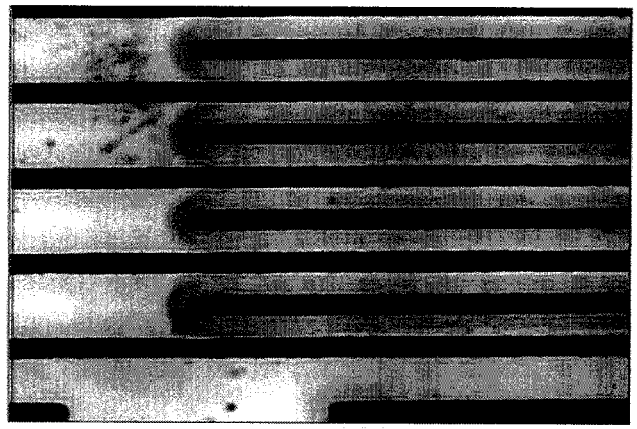
FIG. 7 is a photomicrograph of the electrode section of the evaluation substrate of Comparative Example 2 after a 120-hr insulating reliability evaluation test.

As clearly seen from FIGS. 5 to 7, dendrites formed between the electrodes in Comparative Example 1 and dendrites began to form at the spaces between the electrodes in Comparative Example 2, while no formation of dendrites between the electrodes was observed in Example 1.
(Fabrication of Elastic Modulus Measuring Sample)

The roughened surface of an 18 μm-thick copper foil (HLA18, product of Nippon Denkai Co., Ltd.) was placed onto the resin side of a copper foil with a resin, a double-sided copper-clad laminate was produced under pressing conditions of 170° C., 90 minutes, 4.0 MPa, and the outer copper foils were subjected to double-sided etching for use as a test piece.
(Measurement of Elastic Modulus)

The elastic modulus was measured using a DVE (Model: Rheogel-E-4000, product of UBM). The measuring conditions were: tensile mode, 5 μm amplitude, 10 Hz frequency, 20 mm chuck distance.
(Evaluation of Bendability)

The resin side of a copper foil with a resin (thickness: 60 μm, inner copper foil thickness: 18 μm), or a film with a resin and a copper foil, were attached onto both sides of a prepreg, and a 0.1 mm-thick double-sided copper-clad laminate (product of Hitachi Chemical Co., Ltd., TC-C-300, copper foil thickness: 18 μm) was fabricated under pressing conditions of 170° C., 90 minutes, 4.0 MPa. The outer copper foil of the double-sided copper-clad laminate was subjected to double-sided etching and a 10 mm width×100 mm length test piece was cut out. The test piece was clamped with 0.25 mm-diameter pins and set on the stage, and the test piece was locally bent by 10 passes with a roller at a force of 500 gf on the section of the test piece clamped by the pins, assigning an evaluation of "A" for samples that bent without fracture, and "B" for samples that fractured.

(Fabrication of Prepreg)

Prepregs were fabricated by coating each of the thermosetting resin varnishes prepared in Examples 1-37 and Comparative Examples 1-5 onto a WEX-1027 glass cloth (product of Asahi Shwebel, thickness: 19 μm) to a dried prepreg thickness of 55 μm-65 μm using a vertical coating machine, and then heat-drying it at 120-150° C. for 20 minutes.

TABLE 2

| | Item | Units | Example 1 | Example 2 | Example 3 |
|---|---|---|---|---|---|
| Compositional ratio of monomer mixture A | BA (n-Butyl acrylate) | wt % | 38.7 | 38.7 | 38.7 |
| | EA (Ethyl acrylate) | | 28.8 | 28.8 | 28.8 |
| | GMA (Glycidyl methacrylate) | | 3.0 | 3.0 | 3.0 |
| | AN (Acrylonitrile) | | — | — | — |
| | FA-513AS (Tricyclo[5.2.1.O2,6]deca-8-yl acrylate) | | 29.5 | 29.5 | 29.5 |
| | FA-513MS (Tricyclo[5.2.1.O2,6]deca-8-yl methacrylate) | | — | — | — |
| | Benzyl acrylate | | — | — | — |
| | Total | | 100.0 | 100.0 | 100.0 |
| Acrylic resin molecular weight | Weight-average molecular weight Mw | — | 630000 | 866000 | 991000 |
| Compositional ratio of resin composition | Acrylic resin | Parts by wt. | 40 | 40 | 40 |
| | Biphenyl novolac-type epoxy resin: NC-3000H | | 35 | 35 | 35 |
| | Triazine ring-containing cresol-novolac resin: LA-3018 | | 13 | 13 | 13 |
| | Blocked isocyanate: G-8009L | | 0.2 | 0.2 | 0.2 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.7 | 100.7 | 100.7 |
| CN peak height | Near 2240 $cm^{-1}$ (0 assigned when no peak could be confirmed) | Absorbance | 0 | 0 | 0 |
| Carbonyl group peak height | Near 1730 $cm^{-1}$ | Absorbance | 0.300 | 0.400 | 0.300 |
| CN/carbonyl | CN Peak height/Carbonyl peak height | — | 0 | 0 | 0 |
| Insulation reliability (85° C./85% RH) | Resistance at 0 hr | Ω | $1.3 \times 10^9$ | $9.9 \times 10^8$ | $1.3 \times 10^9$ |
| | Resistance at 120 hrs | Ω | $7.1 \times 10^9$ | $1.1 \times 10^{10}$ | $9.9 \times 10^9$ |
| | Resistance at 1000 hrs | Ω | $7.1 \times 10^9$ | $1.1 \times 10^{10}$ | $9.9 \times 10^9$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $6.0 \times 10^8$ | $6.1 \times 10^8$ | $5.4 \times 10^8$ |
| | Bendability | — | A | A | A |
| Insulation reliability of acrylic resin alone (85° C./85% RH) | Resistance at 0 hr | Ω | $2.0 \times 10^9$ | $2.0 \times 10^9$ | $1.0 \times 10^9$ |
| | Resistance at 120 hrs | Ω | $5.0 \times 10^9$ | $5.0 \times 10^9$ | $4.0 \times 10^9$ |
| | Occurrence of Ion migration | — | No | No | No |

| | Item | Units | Example 4 | Example 5 | Example 6 |
|---|---|---|---|---|---|
| Compositional ratio of monomer mixture A | BA (n-Butyl acrylate) | wt % | 5.0 | 60.0 | 37.0 |
| | EA (Ethyl acrylate) | | 60.0 | 5.0 | 28.0 |
| | GMA (Glycidyl methacrylate) | | 5.0 | 5.0 | 5.0 |
| | AN (Acrylonitrile) | | — | — | — |
| | FA-513AS (Tricyclo[5.2.1.O2,6]deca-8-yl acrylate) | | 30.0 | 30.0 | — |
| | FA-513MS (Tricyclo[5.2.1.O2,6]deca-8-yl methacrylate) | | — | — | 30.0 |
| | Benzyl acrylate | | — | — | — |
| | Total | | 100.0 | 100.0 | 100.0 |
| Acrylic resin molecular weight | Weight-average molecular weight Mw | — | 642000 | 568000 | 584000 |
| Compositional ratio of resin composition | Acrylic resin | Parts by wt. | 40 | 40 | 40 |
| | Biphenyl novolac-type epoxy resin: NC-3000H | | 35 | 35 | 35 |
| | Triazine ring-containing cresol-novolac resin: LA-3018 | | 13 | 13 | 13 |
| | Blocked isocyanate: G-8009L | | 0.2 | 0.2 | 0.2 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.7 | 100.7 | 100.7 |
| CN peak height | Near 2240 $cm^{-1}$ (0 assigned when no peak could be confirmed) | Absorbance | 0 | 0 | 0 |
| Carbonyl group peak height | Near 1730 $cm^{-1}$ | Absorbance | 0.500 | 0.310 | 0.400 |
| CN/carbonyl | CN Peak height/Carbonyl peak height | — | 0 | 0 | 0 |
| Insulation reliability | Resistance at 0 hr | Ω | $1.0 \times 10^9$ | $9.1 \times 10^7$ | $1.5 \times 10^9$ |

TABLE 2-continued

|  |  |  |  |  |  |
|---|---|---|---|---|---|
| (85° C./85% RH) | Resistance at 120 hrs | Ω | $7.4 \times 10^9$ | $1.0 \times 10^{10}$ | $1.6 \times 10^{10}$ |
|  | Resistance at 1000 hrs | Ω | $7.4 \times 10^9$ | $1.0 \times 10^{10}$ | $1.6 \times 10^{10}$ |
|  | Occurrence of Ion migration (120 hrs) | — | No | No | No |
|  | Occurrence of Ion migration (1000 hrs) | — | No | No | No |
| Physical properties | 25° C. storage elastic modulus | Pa | $1.7 \times 10^9$ | $2.8 \times 10^8$ | $1.2 \times 10^9$ |
|  | Bendability | — | A | A | A |
| Insulation reliability | Resistance at 0 hr | Ω | $8.0 \times 10^8$ | $2.0 \times 10^9$ | $5.0 \times 10^9$ |
| of acrylic resin | Resistance at 120 hrs | Ω | $3.0 \times 10^9$ | $6.0 \times 10^9$ | $1.0 \times 10^{10}$ |
| alone (85° C./ | Occurrence of Ion migration | — | No | No | No |
| 85% RH) |  |  |  |  |  |

TABLE 3

|  | Item | Units | Example 7 | Example 8 | Example 9 |
|---|---|---|---|---|---|
| Compositional ratio | BA (n-Butyl acrylate) | wt % | 5.0 | 71.0 | 60.0 |
| of monomer mixture A | EA (Ethyl acrylate) |  | 75.0 | 27.0 | 5.0 |
|  | GMA (Glycidyl methacrylate) |  | 5.0 | 2.0 | 5.0 |
|  | AN (Acrylonitrile) |  | — | — | — |
|  | FA-513AS (Tricyclo[5.2.1.O2,6]deca-8-yl acrylate) |  | 15.0 | — | — |
|  | FA-513MS (Tricyclo[5.2.1.O2,6]deca-8-yl methacrylate) |  | — | — | 30.0 |
|  | Benzyl acrylate |  | — | — | — |
|  | Dimethylacrylamide |  | — | — | — |
|  | Styrene |  | — | — | — |
|  | Total |  | 100.0 | 100.0 | 100.0 |
| Acrylic resin molecular weight | Weight-average molecular weight Mw | — | 636000 | 1296000 | 534000 |
| Compositional ratio | Acrylic resin | Parts by wt. | 40 | 40 | 40 |
| of resin composition | Biphenyl novolac-type epoxy resin: NC-3000H |  | 35 | 35 | 35 |
|  | Triazine ring-containing cresol-novolac resin: LA-3018 |  | 13 | 13 | 13 |
|  | Blocked isocyanate: G-8009L |  | 0.2 | 0.2 | 0.2 |
|  | Phosphorus-based flame retardant: OP930 |  | 12 | 12 | 12 |
|  | Oxidation inhibitor: YOSHINOX BB |  | 0.5 | 0.5 | 0.5 |
|  | Total |  | 100.7 | 100.7 | 100.7 |
| -CN peak height | Near 2240 cm$^{-1}$ (0 assigned when no peak could be confirmed) | Absorbance | 0 | 0 | 0 |
| Carbonyl group peak height | Near 1730 cm$^{-1}$ | Absorbance | 0.310 | 1.760 | 0.337 |
| AN/carbonyl | CN Peak height/Carbonyl peak height | — | 0 | 0 | 0 |
| Insulation reliability | Resistance at 0 hr | Ω | $3.8 \times 10^8$ | $1.2 \times 10^8$ | $1.1 \times 10^9$ |
| (85° C./85% RH) | Resistance at 120 hrs | Ω | $3.2 \times 10^9$ | $2.6 \times 10^9$ | $1.1 \times 10^{10}$ |
|  | Resistance at 1000 hrs | Ω | $3.2 \times 10^9$ | $2.6 \times 10^9$ | $1.1 \times 10^{10}$ |
|  | Occurrence of Ion migration (120 hrs) | — | No | No | No |
|  | Occurrence of Ion migration (1000 hrs) | — | No | No | No |
| Physical properties | 25° C. storage elastic modulus | Pa | $7.1 \times 10^8$ | $2.7 \times 10^7$ | $5.9 \times 10^8$ |
|  | Bendability | — | A | A | A |
| Insulation reliability | Resistance at 0 hr | Ω | $2.0 \times 10^9$ | $5.0 \times 10^7$ | $2.0 \times 10^{10}$ |
| of acrylic resin | Resistance at 120 hrs | Ω | $6.0 \times 10^8$ | $1.0 \times 10^9$ | $1.0 \times 10^{10}$ |
| alone (85° C./ | Occurrence of Ion migration | — | No | No | No |
| 85% RH) |  |  |  |  |  |
|  | Item | Units | Example 10 | Example 11 | Example 12 |
| Compositional ratio | BA (n-Butyl acrylate) | wt % | 5.0 | 10.0 | 56.8 |
| of monomer mixture A | EA (Ethyl acrylate) |  | 60.0 | 80.0 | 21.6 |
|  | GMA (Glycidyl methacrylate) |  | 5.0 | 5.0 | 1.6 |
|  | AN (Acrylonitrile) |  | — | — | — |
|  | FA-513AS (Tricyclo[5.2.1.O2,6]deca-8-yl acrylate) |  | — | — | — |
|  | FA-513MS (Tricyclo[5.2.1.O2,6]deca-8-yl methacrylate) |  | — | — | — |
|  | Benzyl acrylate |  | 30.0 | — | — |
|  | Dimethylacrylamide |  | — | 5.0 | — |
|  | Styrene |  | — | — | 20.0 |
|  | Total |  | 100.0 | 100.0 | 100.0 |
| Acrylic resin molecular weight | Weight-average molecular weight Mw | — | 525000 | 430000 | 1000000 |
| Compositional ratio | Acrylic resin | Parts by wt. | 40 | 40 | 40 |
| of resin composition | Biphenyl novolac-type epoxy resin: NC-3000H |  | 35 | 35 | 35 |
|  | Triazine ring-containing cresol-novolac resin: LA-3018 |  | 13 | 13 | 13 |
|  | Blocked isocyanate: G-8009L |  | 0.2 | 0.2 | 0.2 |
|  | Phosphorus-based flame retardant: OP930 |  | 12 | 12 | 12 |
|  | Oxidation inhibitor: YOSHINOX BB |  | 0.5 | 0.5 | 0.5 |
|  | Total |  | 100.7 | 100.7 | 100.7 |

TABLE 3-continued

| | | | | | |
|---|---|---|---|---|---|
| -CN peak height | Near 2240 cm$^{-1}$ (0 assigned when no peak could be confirmed) | Absorbance | 0 | 0 | 0 |
| Carbonyl group peak height | Near 1730 cm$^{-1}$ | Absorbance | 0.400 | 1.163 | 0.986 |
| AN/carbonyl | CN Peak height/Carbonyl peak height | — | 0 | 0 | 0 |
| Insulation reliability (85° C./85% RH) | Resistance at 0 hr | Ω | $4.2 \times 10^8$ | $7.7 \times 10^6$ | $1.1 \times 10^9$ |
| | Resistance at 120 hrs | Ω | $2.2 \times 10^9$ | $8.0 \times 10^7$ | $1.1 \times 10^{10}$ |
| | Resistance at 1000 hrs | Ω | $2.2 \times 10^9$ | $8.0 \times 10^7$ | $1.1 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $4.6 \times 10^8$ | $1.6 \times 10^9$ | $2.0 \times 10^9$ |
| | Bendability | — | A | A | A |
| Insulation reliability of acrylic resin alone (85° C./85% RH) | Resistance at 0 hr | Ω | $9.0 \times 10^7$ | $1.0 \times 10^8$ | $8.0 \times 10^7$ |
| | Resistance at 120 hrs | Ω | $1.0 \times 10^8$ | $1.0 \times 10^9$ | $3.0 \times 10^9$ |
| | Occurrence of Ion migration | — | No | No | No |

TABLE 4

| | Item | Units | Example 13 | Example 14 | Example 15 |
|---|---|---|---|---|---|
| Compositional ratio of monomer mixture A | BA (n-Butyl acrylate) | wt % | 38.5 | 38.5 | 38.5 |
| | EA (Ethyl acrylate) | | 28.0 | 28.0 | 28.0 |
| | GMA (Glycidyl methacrylate) | | 5.0 | 5.0 | 5.0 |
| | AN (Acrylonitrile) | | — | — | — |
| | FA-513AS (Tricyclo[5.2.1.O2,6]deca-8-yl acrylate) | | 28.5 | 28.5 | 28.5 |
| | FA-513MS (Tricyclo[5.2.1.O2,6]deca-8-yl methacrylate) | | — | — | — |
| | Benzyl acrylate | | — | — | — |
| | Dimethylacrylamide | | — | — | — |
| | Styrene | | — | — | — |
| | Total | | 100.0 | 100.0 | 100.0 |
| Acrylic resin molecular weight | Weight-average molecular weight Mw | — | 64600 | 156100 | 630000 |
| Compositional ratio of resin composition | Acrylic resin | Parts by wt. | 40 | 40 | 10 |
| | Biphenyl novolac-type epoxy resin: NC-3000H | | 35 | 35 | 56.9 |
| | Triazine ring-containing cresol-novolac resin: LA-3018 | | 13 | 13 | 21.1 |
| | Blocked isocyanate: G-8009L | | 0.2 | 0.2 | 0.2 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.7 | 100.7 | 100.7 |
| -CN peak height | Near 2240 cm$^{-1}$ (0 assigned when no peak could be confirmed) | Absorbance | 0 | 0 | 0 |
| Carbonyl group peak height | Near 1730 cm$^{-1}$ | Absorbance | 0.806 | 0.927 | 0.300 |
| AN/carbonyl | CN Peak height/Carbonyl peak height | — | 0 | 0 | 0 |
| Insulation reliability (85° C./85% RH) | Resistance at 0 hr | Ω | $9.1 \times 10^9$ | $8.1 \times 10^9$ | $9.4 \times 10^9$ |
| | Resistance at 120 hrs | Ω | $9.1 \times 10^9$ | $8.1 \times 10^9$ | $5.1 \times 10^{10}$ |
| | Resistance at 1000 hrs | Ω | $9.1 \times 10^9$ | $8.1 \times 10^9$ | $5.1 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $6.0 \times 10^{10}$ | $5.6 \times 10^{10}$ | $6.0 \times 10^8$ |
| | Bendability | — | A | A | A |
| Insulation reliability of acrylic resin alone (85° C./85% RH) | Resistance at 0 hr | Ω | $2.0 \times 10^9$ | $2.0 \times 10^9$ | $9.0 \times 10^9$ |
| | Resistance at 120 hrs | Ω | $5.0 \times 10^9$ | $5.0 \times 10^9$ | $5.0 \times 10^9$ |
| | Occurrence of Ion migration | — | No | No | No |

| | Item | Units | Example 16 | Example 17 | Example 18 |
|---|---|---|---|---|---|
| Compositional ratio of monomer mixture A | BA (n-Butyl acrylate) | wt % | 38.7 | 38.7 | 38.7 |
| | EA (Ethyl acrylate) | | 28.8 | 28.8 | 28.8 |
| | GMA (Glycidyl methacrylate) | | 3.0 | 3.0 | 3.0 |
| | AN (Acrylonitrile) | | — | — | — |
| | FA-513AS (Tricyclo[5.2.1.O2,6]deca-8-yl acrylate) | | 29.5 | 29.5 | 29.5 |
| | FA-513MS (Tricyclo[5.2.1.O2,6]deca-8-yl methacrylate) | | — | — | — |
| | Benzyl acrylate | | — | — | — |
| | Dimethylacrylamide | | — | — | — |
| | Styrene | | — | — | — |
| | Total | | 100.0 | 100.0 | 100.0 |

TABLE 4-continued

| | | | | | |
|---|---|---|---|---|---|
| Acrylic resin molecular weight | Weight-average molecular weight Mw | — | 630000 | 630000 | 630000 |
| Compositional ratio of resin composition | Acrylic resin | Parts by wt. | 20 | 30 | 50 |
| | Biphenyl novolac-type epoxy resin: NC-3000H | | 49.6 | 42.3 | 27.7 |
| | Triazine ring-containing cresol-novolac resin: LA-3018 | | 18.4 | 15.7 | 10.3 |
| | Blocked isocyanate: G-8009L | | 0.2 | 0.2 | 0.1 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.7 | 100.7 | 100.6 |
| -CN peak height | Near 2240 $cm^{-1}$ (0 assigned when no peak could be confirmed) | Absorbance | 0 | 0 | 0 |
| Carbonyl group peak height | Near 1730 $cm^{-1}$ | Absorbance | 0.300 | 0.300 | 0.200 |
| AN/carbonyl | CN Peak height/Carbonyl peak height | — | 0 | 0 | 0 |
| Insulation reliability (85° C./85% RH) | Resistance at 0 hr | Ω | $6.5 \times 10^7$ | $1.3 \times 10^8$ | $2.7 \times 10^9$ |
| | Resistance at 120 hrs | Ω | $5.4 \times 10^{10}$ | $2.4 \times 10^{10}$ | $2.5 \times 10^{10}$ |
| | Resistance at 1000 hrs | Ω | $5.4 \times 10^{10}$ | $2.4 \times 10^{10}$ | $2.5 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $6.0 \times 10^8$ | $6.0 \times 10^8$ | $6.0 \times 10^8$ |
| | Bendability | — | A | A | A |
| Insulation reliability of acrylic resin alone (85° C./85% RH) | Resistance at 0 hr | Ω | $7.0 \times 10^7$ | $1.0 \times 10^8$ | $3.0 \times 10^9$ |
| | Resistance at 120 hrs | Ω | $5.0 \times 10^{10}$ | $2.0 \times 10^{10}$ | $3.0 \times 10^{10}$ |
| | Occurrence of Ion migration | — | No | No | No |

TABLE 5

| | Item | Units | Example 19 | Example 20 | Example 21 |
|---|---|---|---|---|---|
| Compositional ratio of monomer mixture A | tertBA (tert-Butyl acrylate) | wt % | — | — | — |
| | tertBMA (tert-Butyl methacrylate) | | — | — | — |
| | BA (n-Butyl acrylate) | | 38.7 | 38.7 | 38.7 |
| | EA (Ethyl acrylate) | | 28.8 | 28.8 | 28.8 |
| | GMA (Glycidyl methacrylate) | | 3.0 | 3.0 | 3.0 |
| | AN (Acrylonitrile) | | — | — | — |
| | FA-513AS (Tricyclo[5.2.1.O2,6]deca-8-yl acrylate) | | 29.5 | 29.5 | 29.5 |
| | FA-513MS (Tricyclo[5.2.1.O2,6]deca-8-yl methacrylate) | | — | — | — |
| | Total | | 100.0 | 100.0 | 100.0 |
| Acrylic resin molecular weight | Weight-average molecular weight Mw | — | 630000 | 630000 | 630000 |
| Compositional ratio of resin composition | Acrylic resin | Parts by wt. | 60 | 70 | 80 |
| | Biphenyl novolac-type epoxy resin: NC-3000H | | 20.4 | 13.1 | 5.8 |
| | Triazine ring-containing cresol-novolac resin: LA-3018 | | 7.6 | 4.9 | 2.2 |
| | Blocked isocyanate: G-8009L | | 0.1 | 0.1 | 0.05 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.6 | 100.6 | 100.6 |
| -CN peak height | Near 2240 $cm^{-1}$ (0 assigned when no peak could be confirmed) | Absorbance | 0 | 0 | 0 |
| Carbonyl group peak height | Near 1730 $cm^{-1}$ | Absorbance | 0.100 | 0.100 | 0.100 |
| AN/carbonyl | CN Peak height/Carbonyl peak height | — | 0 | 0 | 0 |
| Insulation reliability (85° C./85% RH) | Resistance at 0 hr | Ω | $9.6 \times 10^8$ | $4.4 \times 10^8$ | $2.8 \times 10^8$ |
| | Resistance at 120 hrs | Ω | $8.7 \times 10^9$ | $1.2 \times 10^{10}$ | $1.1 \times 10^{10}$ |
| | Resistance at 1000 hrs | Ω | $8.7 \times 10^9$ | $1.2 \times 10^{10}$ | $1.1 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $6.0 \times 10^8$ | $6.0 \times 10^8$ | $6.0 \times 10^8$ |
| | Bendability | — | A | A | A |
| | Flame retardance | — | | | |
| Insulation reliability of acrylic resin alone (85° C./85% RH) | Resistance at 0 hr | Ω | $1.0 \times 10^9$ | $4.0 \times 10^8$ | $3.0 \times 10^8$ |
| | Resistance at 120 hrs | Ω | $9.0 \times 10^9$ | $1.0 \times 10^{10}$ | $1.0 \times 10^{10}$ |
| | Occurrence of Ion migration | — | No | No | No |

TABLE 5-continued

| Item | | Units | Example 22 | Example 23 | Example 24 |
|---|---|---|---|---|---|
| Compositional ratio of monomer mixture A | tertBA (tert-Butyl acrylate) | wt % | 20.0 | 20.0 | 20.0 |
| | tertBMA (tert-Butyl methacrylate) | | — | — | — |
| | BA (n-Butyl acrylate) | | 28.0 | 45.0 | 35.0 |
| | EA (Ethyl acrylate) | | 17.0 | — | 10.0 |
| | GMA (Glycidyl methacrylate) | | 5.0 | 5.0 | 5.0 |
| | AN (Acrylonitrile) | | — | — | — |
| | FA-513AS (Tricyclo[5.2.1.O2,6]deca-8-yl acrylate) | | 30.0 | 30.0 | 30.0 |
| | FA-513MS (Tricyclo[5.2.1.O2,6]deca-8-yl methacrylate) | | — | — | — |
| | Total | | 100.0 | 100.0 | 100.0 |
| Acrylic resin molecular weight | Weight-average molecular weight Mw | — | 615000 | 582000 | 641000 |
| Compositional ratio of resin composition | Acrylic resin | Parts by wt. | 40 | 40 | 40 |
| | Biphenyl novolac-type epoxy resin: NC-3000H | | 35 | 35 | 35 |
| | Triazine ring-containing cresol-novolac resin: LA-3018 | | 13 | 13 | 13 |
| | Blocked isocyanate: G-8009L | | 0.2 | 0.2 | 0.2 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.7 | 100.7 | 100.7 |
| -CN peak height | Near 2240 cm$^{-1}$ (0 assigned when no peak could be confirmed) | Absorbance | 0 | 0 | 0 |
| Carbonyl group peak height | Near 1730 cm$^{-1}$ | Absorbance | 0.400 | 0.500 | 0.600 |
| AN/carbonyl | CN Peak height/Carbonyl peak height | — | 0 | 0 | 0 |
| Insulation reliability (85° C./85% RH) | Resistance at 0 hr | Ω | $1.0 \times 10^{10}$ | $1.4 \times 10^{10}$ | $1.0 \times 10^{10}$ |
| | Resistance at 120 hrs | Ω | $1.0 \times 10^{10}$ | $2.0 \times 10^{10}$ | $1.0 \times 10^{10}$ |
| | Resistance at 1000 hrs | Ω | $1.0 \times 10^{10}$ | $2.0 \times 10^{10}$ | $1.0 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $2.5 \times 10^{9}$ | $1.1 \times 10^{9}$ | $2.0 \times 10^{9}$ |
| | Bendability | — | A | A | A |
| | Flame retardance | — | V-0 | V-0 | V-0 |
| Insulation reliability of acrylic resin alone (85° C./85% RH) | Resistance at 0 hr | Ω | $1.0 \times 10^{10}$ | $1.0 \times 10^{10}$ | $1.0 \times 10^{10}$ |
| | Resistance at 120 hrs | Ω | $1.0 \times 10^{10}$ | $1.0 \times 10^{10}$ | $1.0 \times 10^{10}$ |
| | Occurrence of Ion migration | — | No | No | No |

TABLE 6

| Item | | Units | Example 25 | Example 26 | Example 27 |
|---|---|---|---|---|---|
| Compositional ratio of monomer mixture A | tertBA (tert-Butyl acrylate) | wt % | 40.0 | 20.0 | — |
| | tertBMA (tert-Butyl methacrylate) | | — | — | 20.0 |
| | BA (n-Butyl acrylate) | | 17.0 | 45.0 | 45.0 |
| | BMA (n-Butyl methacrylate) | | — | — | — |
| | EA (Ethyl acrylate) | | 28.0 | — | — |
| | EMA (Ethyl methacrylate) | | — | — | — |
| | MMA (Methyl methacrylate) | | — | — | — |
| | GMA (Glycidyl methacrylate) | | 5.0 | 5.0 | 5.0 |
| | AN (Acrylonitrile) | | — | — | — |
| | FA-513AS (Tricyclo[5.2.1.O2,6]deca-8-yl acrylate) | | 10.0 | 30.0 | 30.0 |
| | FA-513MS (Tricyclo[5.2.1.O2,6]deca-8-yl methacrylate) | | — | — | — |
| | Styrene | | — | — | — |
| | Total | | 100.0 | 100.0 | 100.0 |
| Acrylic resin molecular weight | Weight-average molecular weight Mw | — | 615000 | 965000 | 582000 |
| Compositional ratio of resin composition | Acrylic resin | Parts by wt. | 40 | 40 | 40 |
| | Biphenyl novolac-type epoxy resin: NC-3000H | | 35 | 35 | 35 |
| | Triazine ring-containing cresol-novolac resin: LA-3018 | | 13 | 13 | 13 |
| | Blocked isocyanate: G-8009L | | 0.2 | 0.2 | 0.2 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.7 | 100.7 | 100.7 |
| -CN peak height | Near 2240 cm$^{-1}$ (0 assigned when no peak could be confirmed) | Absorbance | 0 | 0 | 0 |
| Carbonyl group peak height | Near 1730 cm$^{-1}$ | Absorbance | 0.500 | 0.500 | 0.500 |
| AN/carbonyl | CN Peak height/Carbonyl peak height | — | 0 | 0 | 0 |
| Insulation reliability (85° C./85% RH) | Resistance at 0 hr | Ω | $1.0 \times 10^{10}$ | $1.4 \times 10^{10}$ | $1.4 \times 10^{10}$ |
| | Resistance at 120 hrs | Ω | $2.0 \times 10^{10}$ | $1.0 \times 10^{10}$ | $2.0 \times 10^{10}$ |
| | Resistance at 1000 hrs | Ω | $2.0 \times 10^{10}$ | $1.0 \times 10^{10}$ | $2.0 \times 10^{10}$ |
| | Occurrence of Ion migration (120 hrs) | — | No | No | No |
| | Occurrence of Ion migration (1000 hrs) | — | No | No | No |

TABLE 6-continued

| | | | | | |
|---|---|---|---|---|---|
| Physical properties | 25° C. storage elastic modulus | Pa | $1.4 \times 10^9$ | $1.1 \times 10^9$ | $2.0 \times 10^9$ |
| | Bendability | — | A | A | A |
| | Flame retardance | — | V-0 | V-0 | V-0 |
| Insulation reliability of acrylic resin alone (85° C./85% RH) | Resistance at 0 hr | Ω | $1.0 \times 10^{10}$ | $1.0 \times 10^{10}$ | $1.0 \times 10^{10}$ |
| | Resistance at 120 hrs | Ω | $1.0 \times 10^{10}$ | $1.0 \times 10^{10}$ | $1.0 \times 10^{10}$ |
| | Occurrence of Ion migration | — | No | No | No |

| Item | | Units | Example 28 | Example 29 | Example 30 |
|---|---|---|---|---|---|
| Compositional ratio of monomer mixture A | tertBA (tert-Butyl acrylate) | wt % | — | — | — |
| | tertBMA (tert-Butyl methacrylate) | | — | — | — |
| | BA (n-Butyl acrylate) | | 52.6 | 54.0 | 54.8 |
| | BMA (n-Butyl methacrylate) | | 14.5 | — | — |
| | EA (Ethyl acrylate) | | — | — | — |
| | EMA (Ethyl methacrylate) | | — | 12.0 | — |
| | MMA (Methyl methacrylate) | | — | — | 10.7 |
| | GMA (Glycidyl methacrylate) | | 4.8 | 5.0 | 5.1 |
| | AN (Acrylonitrile) | | — | — | — |
| | FA-513AS (Tricyclo[5.2.1.O2,6]deca-8-yl acrylate) | | 28.1 | 29.0 | 29.4 |
| | FA-513MS (Tricyclo[5.2.1.O2,6]deca-8-yl methacrylate) | | — | — | — |
| | Styrene | | — | — | — |
| | Total | | 100.0 | 100.0 | 100.0 |
| Acrylic resin molecular weight | Weight-average molecular weight Mw | — | 680000 | 655000 | 586000 |
| Compositional ratio of resin composition | Acrylic resin | Parts by wt. | 40 | 40 | 40 |
| | Biphenyl novolac-type epoxy resin: NC-3000H | | 35 | 35 | 35 |
| | Triazine ring-containing cresol-novolac resin: LA-3018 | | 13 | 13 | 13 |
| | Blocked isocyanate: G-8009L | | 0.2 | 0.2 | 0.2 |
| | Phosphorus-based flame retardant: OP930 | | 12 | 12 | 12 |
| | Oxidation inhibitor: YOSHINOX BB | | 0.5 | 0.5 | 0.5 |
| | Total | | 100.7 | 100.7 | 100.7 |
| -CN peak height | Near 2240 cm$^{-1}$ (0 assigned when no peak could be confirmed) | Absorbance | 0 | 0 | 0 |
| Carbonyl group peak height | Near 1730 cm$^{-1}$ | Absorbance | 0.300 | 0.200 | 0.100 |
| AN/carbonyl | CN Peak height/Carbonyl peak height | — | 0 | 0 | 0 |
| Insulation reliability (85° C./85% RH) | Resistance at 0 hr | Ω | $3.0 \times 10^9$ | $4.0 \times 10^9$ | $3.0 \times 10^9$ |
| | Resistance at 120 hrs | Ω | $9.9 \times 10^9$ | $1.0 \times 10^{10}$ | $1.0 \times 10^{10}$ |
| | Resistance at 1000 hrs | Ω | $9.9 \times 10^9$ | $1.0 \times 10^{10}$ | $1.0 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $1.0 \times 10^8$ | $3.0 \times 10^7$ | $8.0 \times 10^8$ |
| | Bendability | — | A | A | A |
| | Flame retardance | — | — | — | — |
| Insulation reliability of acrylic resin alone (85° C./85% RH) | Resistance at 0 hr | Ω | $8.0 \times 10^9$ | $5.0 \times 10^9$ | $5.0 \times 10^9$ |
| | Resistance at 120 hrs | Ω | $7.0 \times 10^9$ | $5.0 \times 10^9$ | $5.0 \times 10^9$ |
| | Occurrence of Ion migration | — | No | No | No |

TABLE 7

| Item | | Units | Example 31 | Example 32 | Example 33 |
|---|---|---|---|---|---|
| Compositional ratio of monomer mixture A | BA (n-Butyl acrylate) | wt % | 39.5 | 56.9 | 68.1 |
| | BMA (n-Butyl methacrylate) | | — | — | — |
| | GMA (Glycidyl methacrylate) | | 4.4 | 4.6 | — |
| | 2EHMA (2-Ethylhexyl methacrylate) | | 30.6 | — | — |
| | LMA (Lauryl methacrylate) | | — | 11.6 | — |
| | AA (Acrylic acid) | | — | — | 2.6 |
| | FA-513AS (Tricyclo[5.2.1.O2,6]deca-8-yl acrylate) | | 25.5 | 26.9 | 29.3 |
| | FA-513MS (Tricyclo[5.2.1.O2,6]deca-8-yl methacrylate) | | — | — | — |
| | Total | | 100.0 | 100.0 | 100.0 |
| Acrylic resin molecular weight | Weight-average molecular weight Mw | — | 553000 | 555000 | 647000 |
| Compositional ratio of resin composition | Acrylic resin | Parts by wt. | 40 | 40 | 40 |
| | Biphenyl novolac-type epoxy resin: NC-3000H | | 35 | 35 | 35 |
| | Triazine ring-containing cresol-novolac resin: LA-3018 | | 13 | 13 | 13 |
| | Naphthalene-containing epoxy resin: EXA-4710 | | — | — | — |
| | Cresol-novolac type epoxy resin: N673 | | — | — | — |
| | Cresol-novolac type phenol resin KA-1165 | | — | — | — |
| | Blocked isocyanate: G-8009L | | 0.2 | 0.2 | 0.2 |
| | Phosphorus-based flame retardant: OP930 | | 12 | 12 | 12 |
| | Oxidation inhibitor: YOSHINOX BB | | 0.5 | 0.5 | 0.5 |
| | Aluminum hydroxide: HP360 | | — | — | — |
| | Total | | 100.7 | 100.7 | 100.7 |

TABLE 7-continued

| | | | | | |
|---|---|---|---|---|---|
| -CN peak height | Near 2240 cm⁻¹ (0 assigned when no peak could be confirmed) | Absorbance | 0 | 0 | 0 |
| Carbonyl group peak height | Near 1730 cm⁻¹ | Absorbance | 0.100 | 0.100 | 0.400 |
| AN/carbonyl | CN Peak height/Carbonyl peak height | — | 0 | 0 | 0 |
| Insulation reliability (85° C./85% RH) | Resistance at 0 hr | Ω | $1.0 \times 10^{10}$ | $3.0 \times 10^{9}$ | $7.0 \times 10^{9}$ |
| | Resistance at 120 hrs | Ω | $2.0 \times 10^{10}$ | $7.0 \times 10^{9}$ | $1.0 \times 10^{10}$ |
| | Resistance at 1000 hrs | Ω | $2.0 \times 10^{10}$ | $7.0 \times 10^{9}$ | $1.0 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $3.0 \times 10^{8}$ | $3.0 \times 10^{7}$ | $6.0 \times 10^{8}$ |
| | Bendability | — | A | A | A |
| Insulation reliability of acrylic resin alone (85° C./85% RH) | Resistance at 0 hr | Ω | $7.0 \times 10^{9}$ | $3.0 \times 10^{9}$ | $2.0 \times 10^{9}$ |
| | Resistance at 120 hrs | Ω | $6.0 \times 10^{9}$ | $4.0 \times 10^{9}$ | $1.0 \times 10^{9}$ |
| | Occurrence of Ion migration | — | No | No | No |

| | Item | Units | Example 34 | Example 35 | Example 36 |
|---|---|---|---|---|---|
| Compositional ratio of monomer mixture A | BA (n-Butyl acrylate) | wt % | 20.0 | 20.0 | 20.0 |
| | BMA (n-Butyl methacrylate) | | 31.1 | 31.1 | 31.1 |
| | GMA (Glycidyl methacrylate) | | 4.4 | 4.4 | 4.4 |
| | 2EHMA (2-Ethylhexyl methacrylate) | | 18.7 | 18.7 | 18.7 |
| | LMA (Lauryl methacrylate) | | — | — | — |
| | AA (Acrylic acid) | | — | — | — |
| | FA-513AS (Tricyclo[5.2.1.O2,6]deca-8-yl acrylate) | | 25.8 | 25.8 | 25.8 |
| | FA-513MS (Tricyclo[5.2.1.O2,6]deca-8-yl methacrylate) | | — | — | — |
| | Total | | 100.0 | 100.0 | 100.0 |
| Acrylic resin molecular weight | Weight-average molecular weight Mw | — | 474000 | 474000 | 474000 |
| Compositional ratio of resin composition | Acrylic resin | Parts by wt. | 40 | 40 | 40 |
| | Biphenyl novolac-type epoxy resin: NC-3000H | | 35 | — | — |
| | Triazine ring-containing cresol-novolac resin: LA-3018 | | 13 | — | — |
| | Naphthalene-containing epoxy resin: EXA-4710 | | — | 23.1 | — |
| | Cresol-novolac type epoxy resin: N673 | | — | — | 25.0 |
| | Cresol-novolac type phenol resin KA-1165 | | — | 16.1 | 14.0 |
| | Blocked isocyanate: G-8009L | | 0.2 | 0.1 | 0.1 |
| | Phosphorus-based flame retardant: OP930 | | 12 | 11.2 | 12 |
| | Oxidation inhibitor: YOSHINOX BB | | 0.5 | — | — |
| | Aluminum hydroxide: HP360 | | — | 9.52 | 8.9 |
| | Total | | 100.7 | 100.0 | 100.0 |
| -CN peak height | Near 2240 cm⁻¹ (0 assigned when no peak could be confirmed) | Absorbance | 0 | 0 | 0 |
| Carbonyl group peak height | Near 1730 cm⁻¹ | Absorbance | 0.200 | 0.100 | 0.100 |
| AN/carbonyl | CN Peak height/Carbonyl peak height | — | 0 | 0 | 0 |
| Insulation reliability (85° C./85% RH) | Resistance at 0 hr | Ω | $5.0 \times 10^{9}$ | $5.0 \times 10^{9}$ | $5.0 \times 10^{9}$ |
| | Resistance at 120 hrs | Ω | $1.0 \times 10^{10}$ | $1.0 \times 10^{10}$ | $1.0 \times 10^{10}$ |
| | Resistance at 1000 hrs | Ω | $1.0 \times 10^{10}$ | $1.0 \times 10^{10}$ | $1.0 \times 10^{10}$ |
| | Occurrence of Ion migration (120 hrs) | — | No | No | No |
| | Occurrence of Ion migration (1000 hrs) | — | No | No | No |
| Physical properties | 25° C. storage elastic modulus | Pa | $2.0 \times 10^{9}$ | $5.0 \times 10^{8}$ | $1.0 \times 10^{9}$ |
| | Bendability | — | A | A | A |
| Insulation reliability of acrylic resin alone (85° C./85% RH) | Resistance at 0 hr | Ω | $3.0 \times 10^{10}$ | $3.0 \times 10^{10}$ | $3.0 \times 10^{10}$ |
| | Resistance at 120 hrs | Ω | $3.0 \times 10^{10}$ | $3.0 \times 10^{10}$ | $3.0 \times 10^{10}$ |
| | Occurrence of Ion migration | — | No | No | No |

TABLE 8

| | Item | Units | Example 37 | Comp. Ex. 1 | Comp. Ex. 2 |
|---|---|---|---|---|---|
| Compositional ratio of monomer mixture A | tertBA (tert-Butyl acrylate) | wt % | — | — | — |
| | tertBMA (tert-Butyl methacrylate) | | — | — | — |
| | BA (n-Butyl acrylate) | | 5.0 | 50.0 | 5.0 |
| | EA (Ethyl acrylate) | | 88.7 | 10.0 | 85.0 |
| | GMA (Glycidyl methacrylate) | | 5.0 | 5.0 | 5.0 |
| | AN (Acrylonitrile) | | 1.3 | 35.0 | 5.0 |
| | FA-513AS (Tricyclo[5.2.1.O2,6]deca-8-yl acrylate) | | — | — | — |
| | FA-513MS (Tricyclo[5.2.1.O2,6]deca-8-yl methacrylate) | | — | — | — |
| | Styrene | | — | — | — |
| | Total | | 100.0 | 100.0 | 100.0 |

TABLE 8-continued

| | | | | | |
|---|---|---|---|---|---|
| Acrylic resin molecular weight | Weight-average molecular weight Mw | — | 889000 | 424000 | 889000 |
| Compositional ratio of resin composition | Acrylic resin | Parts by wt. | 20 | 40 | 40 |
| | Biphenyl novolac-type epoxy resin: NC-3000H | | 48 | 35 | 35 |
| | Triazine ring-containing cresol-novolac resin: LA-3018 | | 11.4 | 13 | 13 |
| | Blocked isocyanate: G-8009L | | 0.14 | 0.2 | 0.2 |
| | Phosphorus-based flame retardant: OP930 | | 11 | 12 | 12 |
| | Oxidation inhibitor: YOSHINOX BB | | — | 0.5 | 0.5 |
| | Aluminum hydroxide: HP360 | | 9.5 | — | — |
| | Total | | 100.0 | 100.7 | 100.7 |
| -CN peak height | Near 2240 cm$^{-1}$ (0 assigned when no peak could be confirmed) | Absorbance | 0.002 | 0.090 | 0.050 |
| Carbonyl group peak height | Near 1730 cm$^{-1}$ | Absorbance | 2.500 | 0.720 | 0.710 |
| AN/carbonyl | CN Peak height/Carbonyl peak height | — | 0.0007 | 0.1250 | 0.0704 |
| Insulation reliability (85° C./85% RH) | Resistance at 0 hr | Ω | $8.0 \times 10^8$ | $2.5 \times 10^7$ | $3.0 \times 10^7$ |
| | Resistance at 120 hrs | Ω | $4.0 \times 10^9$ | $5.1 \times 10^8$ | $6.1 \times 10^8$ |
| | Resistance at 1000 hrs | Ω | $4.0 \times 10^9$ | $1.2 \times 10^7$ | $6.0 \times 10^7$ |
| | Occurrence of Ion migration (120 hrs) | — | No | Yes | Yes |
| | Occurrence of Ion migration (1000 hrs) | — | No | Yes | Yes |
| Physical properties | 25° C. storage elastic modulus | Pa | $1.0 \times 10^9$ | $2.3 \times 10^9$ | $1.9 \times 10^8$ |
| | Bendability | — | A | A | A |
| Insulation reliability of acrylic resin alone (85° C./85% RH) | Resistance at 0 hr | Ω | $3.0 \times 10^7$ | $3.0 \times 10^7$ | $3.0 \times 10^7$ |
| | Resistance at 120 hrs | Ω | $2.0 \times 10^8$ | $1.0 \times 10^9$ | $2.0 \times 10^8$ |
| | Occurrence of Ion migration | — | No | Yes | Yes |

| Item | | Units | Comp. Ex. 3 | Comp. Ex. 4 | Comp. Ex. 5 |
|---|---|---|---|---|---|
| Compositional ratio of monomer mixture A | tertBA (tert-Butyl acrylate) | wt % | — | — | — |
| | tertBMA (tert-Butyl methacrylate) | | — | — | — |
| | BA (n-Butyl acrylate) | | 2.5 | 5.0 | 5.0 |
| | EA (Ethyl acrylate) | | 42.5 | 85.0 | 87.5 |
| | GMA (Glycidyl methacrylate) | | 2.5 | 5.0 | 5.0 |
| | AN (Acrylonitrile) | | 2.5 | 5.0 | 2.5 |
| | FA-513AS (Tricyclo[5.2.1.O2,6]deca-8-yl acrylate) | | — | — | — |
| | FA-513MS (Tricyclo[5.2.1.O2,6]deca-8-yl methacrylate) | | — | — | — |
| | Styrene | | 50 | — | — |
| | Total | | 100.0 | 100.0 | 100.0 |
| Acrylic resin molecular weight | Weight-average molecular weight Mw | — | 910000 | 889000 | 889000 |
| Compositional ratio of resin composition | Acrylic resin | Parts by wt. | 40 | 20 | 20 |
| | Biphenyl novolac-type epoxy resin: NC-3000H | | 35 | 48 | 48 |
| | Triazine ring-containing cresol-novolac resin: LA-3018 | | 13 | 11.4 | 11.4 |
| | Blocked isocyanate: G-8009L | | 0.2 | 0.14 | 0.14 |
| | Phosphorus-based flame retardant: OP930 | | 12 | 11 | 11 |
| | Oxidation inhibitor: YOSHINOX BB | | 0.5 | — | — |
| | Aluminum hydroxide: HP360 | | — | 9.5 | 9.5 |
| | Total | | 100.7 | 100.0 | 100.0 |
| -CN peak height | Near 2240 cm$^{-1}$ (0 assigned when no peak could be confirmed) | Absorbance | 0.003 | 0.003 | 0.003 |
| Carbonyl group peak height | Near 1730 cm$^{-1}$ | Absorbance | 1.868 | 2.261 | 2.500 |
| AN/carbonyl | CN Peak height/Carbonyl peak height | — | 0.0018 | 0.0013 | 0.0012 |
| Insulation reliability (85° C./85% RH) | Resistance at 0 hr | Ω | $5.0 \times 10^7$ | $6.0 \times 10^8$ | $8.0 \times 10^8$ |
| | Resistance at 120 hrs | Ω | $9.1 \times 10^8$ | $2.0 \times 10^9$ | $4.0 \times 10^9$ |
| | Resistance at 1000 hrs | Ω | $1.0 \times 10^8$ | $1.0 \times 10^9$ | $4.0 \times 10^9$ |
| | Occurrence of Ion migration (120 hrs) | — | Yes | Yes | No |
| | Occurrence of Ion migration (1000 hrs) | — | Yes | Yes | Yes |
| Physical properties | 25° C. storage elastic modulus | Pa | $2.6 \times 10^9$ | $1.0 \times 10^9$ | $1.0 \times 10^9$ |
| | Bendability | — | A | A | A |
| Insulation reliability of acrylic resin alone (85° C./85% RH) | Resistance at 0 hr | Ω | $4.0 \times 10^7$ | $3.0 \times 10^7$ | $3.0 \times 10^7$ |
| | Resistance at 120 hrs | Ω | $4.0 \times 10^8$ | $2.0 \times 10^8$ | $2.0 \times 10^8$ |
| | Occurrence of Ion migration | — | Yes | Yes | Yes |

TABLE 9

| Component | Content (parts by wt.) |
| --- | --- |
| Naphthalene-type epoxy resin (EXA-4710: product of DIC) | 23.1 |
| Cresol-novolac type phenol resin (KA-1165, trade name of DIC) | 16.1 |
| Blocked isocyanate (G-8009L: product of JER) | 0.1 |
| Acrylic resin (as solid resin portion) | 40 |
| OP930 (trade name of Clariant, Japan) | 11.2 |
| Aluminum hydroxide (HP360, trade name of Showa Denko, KK.) | 9.52 |
| Total | 100.0 |

TABLE 10

| Component | Content (parts by wt.) |
| --- | --- |
| Cresol-novolac type epoxy resin (N-673, product of DIC) | 25 |
| Cresol-novolac type phenol resin (KA-1165, trade name of DIC) | 14 |
| Blocked isocyanate (G-8009L: product of JER) | 0.1 |
| Acrylic resin (as solid resin portion) | 40 |
| OP930 (trade name of Clariant, Japan) | 12 |
| Aluminum hydroxide (HP360, trade name of Showa Denko, KK.) | 8.9 |
| Total | 100.0 |

TABLE 11

| Component | Content (parts by wt.) |
| --- | --- |
| Biphenyl novolac-type epoxy resin (NC-3000H: Nippon Kayaku Co., Ltd.) | 48 |
| Triazine ring-containing cresol-novolac type phenol resin (PHENOLITE LA-3018, trade name of DIC, as solid resin portion) | 11.4 |
| Blocked isocyanate (G-8009L: product of JER) | 0.14 |
| Acrylic resin (as solid resin portion) | 20 |
| OP930 (trade name of Clariant, Japan) | 11 |
| Aluminum hydroxide (HP360, trade name of Showa Denko, KK.) | 9.5 |
| Total | 100.0 |

As clearly seen in Tables 2-8, the evaluation substrates of Examples 1-37 had low occurrence of ion migration and excellent insulating reliability, compared to the evaluation substrates of Comparative Examples 1-5. Examples 13 and 14, which contained only trace nitrile groups, were satisfactory, with no detection of $P_{CN}$ ($P_{CN}/P_{CO} \le 0.001$) and no ion migration. In Example 37, with $P_{CN}/P_{CO} \le 0.0007$ (equal to or less than 0.001), no ion migration occurred even after 1000 hrs and the insulating reliability resistance value was also high, indicating stability and excellence, but in Comparative Example 4, with $P_{CN}/P_{CO} > 0.001$, a reduced insulation resistance value was observed from 120 hrs to 1000 hrs. In the other Comparative Example 5, with $P_{CN}/P_{CO} > 0.001$, ion migration was observed after 1000 hrs. The evaluation substrates of Examples 22-27 are even more preferred for their superior flame retardance. Evaluation of the insulating reliability of each copper foil with a resin, film with a resin or prepreg using varnishes with equivalent compositions yielded the same results, with no observed difference. Also, the evaluation substrate of Example 8 exhibited satisfactory results for ion migration and bending performance, but the storage elastic modulus at 25° C. was extremely low compared to the evaluation substrates of the other examples. In addition, the copper foil with a resin, film with a resin and prepreg of Example 8 had very strong tack compared to the samples prepared in the other examples.

(Evaluation of Insulating Reliability of Acrylic Resin Alone)

The acrylic resins synthesized in Examples 1-37 and Comparative Examples 1-5 were evaluated for insulating reliability by the methods described above. The results are shown in Tables 2 to 8.

As clearly seen from Tables 2 to 8, the acrylic resins of Examples 1-37 exhibited no ion migration, while the acrylic resins of Comparative Examples 1-5 exhibited ion migration. These results indicate that the occurrence of ion migration is determined by the amount of nitrile groups in the acrylic resin.

EXPLANATION OF SYMBOLS

10: Metal foil, 11: wiring pattern, 30: substrate, 60: metal-plated layer, 70: through-hole, 100: prepreg, 200: metal-clad laminate, 300: printed wiring board.

The invention claimed is:

1. A printed wiring board comprising at least a prepreg formed by impregnating a fiber base material with a resin composition, wherein:

the resin composition comprises a thermosetting resin, a curing agent, and an acrylic resin obtained by polymerizing a monomer mixture, a mixing ratio of the thermosetting resin being 10-90 wt % with respect to the total solid portion of the resin composition, the monomer mixture consisting of:

5-30 parts by weight of a compound represented by the following formula (1),

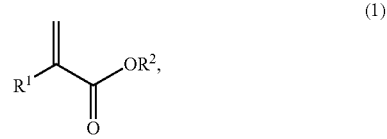

wherein $R^1$ represents a hydrogen atom or a methyl group and $R^2$ represents a C5-10 cycloalkyl or C6-13 cycloalkylalkyl group;

0.5-30 parts by weight of a functional group-containing monomer, the functional group comprising at least one of an acid anhydride group, an amino group, an amide group or an epoxy group; and 40-94.5 parts by weight of a third monomer that is copolymerizable with the functional group-containing monomer and the compound represented by formula (1) and has no nitrile groups in the structure, wherein the third monomer is at least one monomer selected from the group consisting of methyl acrylate, ethyl acrylate, n-propyl acrylate, i-propyl acrylate, n-butyl acrylate, i-butyl acrylate, t-butyl acrylate, pentyl acrylate, n-hexyl acrylate, 2-ethylhexyl acrylate, n-octyl acrylate, dodecyl acrylate, octadecyl acrylate, butoxyethyl acrylate, methyl methacrylate, ethyl methacrylate, n-propyl methacrylate, i-propyl methacrylate, n-butyl methacrylate, i-butyl methacrylate, t-butyl methacrylate, pentyl methacrylate, n-hexyl methacrylate, 2-ethylhexyl methacrylate, n-octyl methacrylate, lauryl methacrylate, dodecyl methacrylate, octadecyl methacrylate, butoxyethyl methacrylate, 4-vinylpyridine, 2-vinylpyridine, α-methylstyrene, α-ethylstyrene, α-fluorostyrene, α-chlorostyrene, α-bromostyrene, fluorostyrene, chlorostyrene, bromostyrene, methylstyrene, methoxystyrene and styrene, the amounts of the compound represented by formula (1), the functional group-containing monomer and the third monomer combine to a total amount of 100 parts by weight, and the ratio of the peak height near 2240 cm$^{-1}$ due to nitrile groups ($P_{CN}$) to the peak height near 1730 cm$^{-1}$ due to carbonyl groups ($P_{CO}$) in the IR spectrum of the cured resin composition ($P_{CN}/P_{CO}$) is no greater than 0.001.

2. The printed wiring board according to claim 1, wherein the acrylic resin is one employing a methacrylic acid ester or acrylic acid ester having a C5-10 cycloalkyl group in the ester portion, as the compound represented by formula (1).

3. The printed wiring board according to claim 1, wherein the C5-10 cycloalkyl group contains at least one group selected from the group consisting of cyclohexyl, norbornyl, tricyclodecanyl, isobornyl and adamantyl.

4. The printed wiring board according to claim 1, wherein the weight-average molecular weight (Mw) of the acrylic resin is 50,000-1,500,000.

5. A printed wiring board comprising at least a prepreg formed by impregnating a fiber base material with a resin composition, wherein:

the resin composition comprises a thermosetting resin, a curing agent, and an acrylic resin, a mixing ratio of the thermosetting resin being 10-90 wt % with respect to the total solid portion of the resin composition, the acrylic resin being an acrylic resin obtained by polymerizing a monomer mixture consisting of:

5-30 parts by weight of a compound represented by the following formula (1):

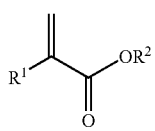

(1)

wherein R$^1$ represents a hydrogen atom or a methyl group and R$^2$ represents a C5-10 cycloalkyl or C6-13 cycloalkylalkyl group, 0.5-30 parts by weight of a functional group-containing monomer having a functional group comprising at least one of an acid anhydride group, an amino group, an amide group or an epoxy group, and 40-94.5 parts by weight of another monomer that is copolymerizable with these components and has no nitrile groups in the structure, wherein the another monomer is at least one monomer selected from the group consisting of methyl acrylate, ethyl acrylate, n-propyl acrylate, i-propyl acrylate, n-butyl acrylate, i-butyl acrylate, t-butyl acrylate, pentyl acrylate, n-hexyl acrylate, 2-ethylhexyl acrylate, n-octyl acrylate, dodecyl acrylate, octadecyl acrylate, butoxyethyl acrylate, methyl methacrylate, ethyl methacrylate, n-propyl methacrylate, i-propyl methacrylate, n-butyl methacrylate, i-butyl methacrylate, t-butyl methacrylate, pentyl methacrylate, n-hexyl methacrylate, 2-ethylhexyl methacrylate, n-octyl methacrylate, lauryl methacrylate, dodecyl methacrylate, octadecyl methacrylate, butoxyethyl methacrylate, 4-vinylpyridine, 2-vinylpyridine, α-methylstyrene, α-ethylstyrene, α-fluorostyrene, α-chlorostyrene, α-bromostyrene, fluorostyrene, chlorostyrene, bromostyrene, methylstyrene, methoxystyrene and styrene, and the compound represented by the formula (1), the functional group-containing monomer, and the another monomer are combined to a total amount of 100 parts by weight.

6. The printed wiring board according to claim 5, wherein the acrylic resin is one employing a methacrylic acid ester or acrylic acid ester having a C5-10 cycloalkyl group in the ester portion, as the compound represented by formula (1).

7. The printed wiring board according to claim 6, wherein the C5-10 cycloalkyl group contains at least one group selected from the group consisting of cyclohexyl, norbornyl, tricyclodecanyl, isobornyl and adamantyl.

8. The printed wiring board according to claim 5, wherein the weight-average molecular weight (Mw) of the acrylic resin is 50,000-1,500,000.

9. The printed wiring board according to claim 1, wherein the C5-10 cycloalkyl group contains at least one group selected from the group consisting of norbornyl, tricyclodecanyl, and adamantyl.

10. The printed wiring board according to claim 5, wherein the C5-10 cycloalkyl group contains at least one group selected from the group consisting of norbornyl, tricyclodecanyl, and adamantyl.

* * * * *